(12) United States Patent
Shibahara et al.

(10) Patent No.: US 7,129,691 B2
(45) Date of Patent: Oct. 31, 2006

(54) CURRENT SENSOR AND CURRENT SENSOR MANUFACTURING METHOD

(75) Inventors: Koji Shibahara, Tokyo (JP); Radivoje Popovic, St-Sulpice (CH); Yo Yamagata, Shizuoka (JP); Robert Racz, Zug (CH)

(73) Assignees: Sentron AG, Zug (CH); Asahi Kasei EMD Corporation, Tokyo (JP)

( * ) Notice: Subject to any disclaimer, the term of this patent is extended or adjusted under 35 U.S.C. 154(b) by 199 days.

(21) Appl. No.: 10/493,985

(22) PCT Filed: Nov. 1, 2002

(86) PCT No.: PCT/JP02/11473

§ 371 (c)(1),
(2), (4) Date: Apr. 29, 2004

(87) PCT Pub. No.: WO03/038452

PCT Pub. Date: May 8, 2003

(65) Prior Publication Data

US 2005/0030018 A1     Feb. 10, 2005

(30) Foreign Application Priority Data

Nov. 1, 2001     (JP)     .............................. 2001-336682

(51) Int. Cl.
G01R 15/20     (2006.01)
(52) U.S. Cl. ................... 324/117 H; 324/126; 324/251
(58) Field of Classification Search ............ 324/117 R, 324/117 H, 126, 127, 251
See application file for complete search history.

(56) References Cited

U.S. PATENT DOCUMENTS

| 4,587,509 | A  | * | 5/1986 | Pitt et al. ................... 338/32 H |
| 5,942,895 | A  | * | 8/1999 | Popovic et al. ............. 324/251 |
| 6,184,679 | B1 |   | 2/2001 | Popovic et al. |
| 6,356,068 | B1 |   | 3/2002 | Steiner et al. |
| 6,989,665 | B1 | * | 1/2006 | Goto ..................... 324/117 H |

FOREIGN PATENT DOCUMENTS

| DE | 44 10 180 A1 | 3/1994 |
| JP | 61-080074 | 4/1986 |
| JP | 04-029510 | 1/1992 |
| JP | 4-148869 | 5/1992 |
| JP | 09-090007 | 4/1997 |
| JP | 2000-193728 | 7/2000 |

* cited by examiner

Primary Examiner—Ernest Karlsen
Assistant Examiner—Arleen M. Vazquez
(74) Attorney, Agent, or Firm—McCormick, Paulding & Huber LLP

(57) ABSTRACT

A low-cost, current sensor suitable for mass production and a manufacturing method thereof are provided. The current sensor is small with high sensitivity and can be packaged in a standard assembly line which is normally used when an integrated circuit is manufactured. Further, it is possible to obtain a sufficient shielding effect against a disturbance flux without degrading the detecting sensitivity of a flux. A first magnetic material 50 is bonded to the lower part of a current conductor 22C. The first magnetic material 50 has the function of converging and amplifying a flux 3 generated by the current to be measured. A second magnetic material 51 is bonded above a magnetic sensor chip 20. The second magnetic material 51 has a shielding function against a disturbance flux entering from the outside.

8 Claims, 17 Drawing Sheets

CURRENT SENSOR AND CURRENT SENSOR MANUFACTURING METHOD

CROSS REFERENCE TO RELATED APPLICATIONS

This Application is a 371 of PCT/JP02/11473, filed Nov. 01, 2002.

The present application is related to and claims priority of the following co-pending applications, namely, PCT application number PCT/JP02/11473 of Sentron AG and ASAHI KASEI EMD CORPORATION entitled "Current Sensor and Current Sensor Manufacturing Method", filed on Nov. 1, 2002; and JP Application No. 2001-336682, filed Nov. 1, 2001. The above-identified applications are incorporated herein by reference in their entirety.

BACKGROUND OF THE INVENTION

1. Field of the Invention

The present invention relates to a current sensor and a method of manufacturing the current sensor.

To be specific, the present invention relates to a current sensor of magnetoelectric conversion type, which measures the intensity of a current by detecting a flux generated by the current to be measured with a magnetic field detection element, and a manufacturing method thereof.

2. Description of the Related Art

A Hall sensor using the Hall effect, a magnetoresistive element, a magnetic transistor, etc (or these including an ASIC for amplifying function or adjusting function) are widely known as magnetic sensors. Capturing a magnetic flux created around a current to be measured and measuring its current intensity can be done by using such magnetic field sensors.

For this purpose, a current sensor structure shown in FIG. 1 is widely used conventionally.

However, the current sensor having the configuration of FIG. 1 is not suitable for miniaturization because the sensor requires a magnetic core 4 surrounding a current conductor 2 fed with current. Further, since the magnetic core 4 and a Hall element 6 need to be separately manufactured and then assembled into one, the sensor has not been suitable for mass production and the cost is not low.

In order to solve such an inconvenience, "a magnetic field sensor with a terminal for detecting current" containing a chip with a magnetoelectric conversion element sealed with plastics has been proposed in Japanese Patent Application Laid-Open No. 61-80074 (1986). This publication discloses "a magnetic field sensor with a terminal for detecting current. This magnetic field sensor comprises a current conductor, a magnetoelectric conversion element chip placed on a part of the above current conductor (except both sides of the conductor), lead frames (each side of which are connected to the chip) and a sealing part (for integrally sealing the end of the lead frame, the magnetoelectric conversion element chip, and the part of the chip located on a current conductor). This magnetic field sensor is characterized in that the sensor has both ends of the current conductor as external terminals for current detection".

However, the invention disclosed in Japanese Patent Application Laid-Open No. 61-80074 (1986) has the following problems:

In the invention disclosed in Japanese Patent Application Laid-Open No. 61-80074 (1986), when current flows in the current conductor, a flux appearing concentrically around the current conductor is detected by a magnetic field sensor chip which is placed closely to a surface of the current conductor. And the magnetic field sensor chip mainly has sensitivity only to a flux which is perpendicular to the surface of the chip. The sensor has extremely low sensitivity to a flux in a horizontal direction. For this reason, it is difficult to detect current with high sensitivity.

The magnetic field sensor chip is sensitive to a flux which is perpendicular to the surface of the chip. It is rotated by 90°, and further, the magnetic field sensor chip is placed on a current conductor to detect the current flux in such a way that a flux generated by the current goes through the chip surface perpendicularly.

However, the invention is not practical and lacks mass productivity, considering complexity of a method of fixing the magnetic field sensor chip on the current conductor and a wire bonding method between a sensor chip terminal and a lead frame.

(2) There may be a current which is not a current to be measured around the current sensor. In such an environment, the invention disclosed in Japanese Patent Application Laid-Open No. 61-80074 (1986) is susceptible to an external flux generated by surrounding current. Thus, it is difficult to detect accurately a flux generated by the current to be measured.

(3) In the invention disclosed in Japanese Patent Application Laid-Open No. 61-80074 (1986), the current conductor and the surface of the lead frame (which is connected to the terminal of the magnetic field sensor chip) are not formed on the same height of a plane. Thus, it is difficult to form the lead frame and a current conductor in the process of packaging. And then, at the same time, the invention is not suitable for mass production.

(4) Proper shielding has not been sufficiently performed in the case where a flux generated by disturbance or an external interference magnetic field exists around the magnetic field sensor. In other words, it is desirable to guiding a magnetic flux to be measured by a magnetic detection element while suppressing a disturbance flux to be eliminated. If this is done effectively, a current sensor will contain a smaller measurement error and hold enough magnetic shield. In an actual one-chip current sensor, it has not been achieved efficiently yet.

Therefore, the present invention provides a low-cost current sensor suitable for mass production and a manufacturing method, the current sensor is small with high sensitivity and can be packaged in a standard assembly line which is normally used for manufacturing an integrated circuit.

Another object of the present invention is to provide a current sensor which is packaged in a standard assembly line with sufficient shielding effect against a disturbance flux, and to provide a manufacturing method thereof.

SUMMARY OF THE INVENTION

In the first aspect of the present invention, there is provided a current sensor which comprises a magnetic field detection element placed on a current conductor passed by a current to be measured, wherein the magnetic field detection element is placed close to a flux concentrator for converging a flux generated by the current to be measured, and wherein an input/output terminal of the magnetic field detection element is placed on the same height of a plane compared to that of the current conductor or is placed on a plane which has a predetermined height difference compared to that of the current conductor.

As for the second aspect of the present invention, in the first claim of the current sensor, the flux concentrator may be composed of a pair of members having a gap between them.

As for the third aspect of the present invention, the current sensor in the first claim, it may further comprise a first magnetic material on the backside of the current conductor, on which side the magnetic field detection element is not located.

As for the fourth aspect of the present invention, the current sensor in the third claim, it may further comprise a second magnetic material above the current conductor, on which side the magnetic field detection element is located.

As for the fifth aspect of the present invention, the current sensor mentioned in the fourth claim, a position of the second magnetic material may be set so as to satisfy $0.1\alpha \leq X \leq 3.6\alpha$ where $\alpha$ represents a whole length of the flux concentrator along a direction of a flux generated by the current to be measured and X represents a distance between a magnetic detecting surface of the magnetic field detection element and the second magnetic material.

As for the sixth aspect of the present invention, the detection sensitivity of the magnetic field detection element is substantially increased by reducing a width of the current conductor where the magnetic field detection element is placed on.

As for the seventh aspect of the present invention, there is provided a method of manufacturing a current sensor, which comprises a magnetic field detection element on a current conductor passed by a current to be measured,
wherein the magnetic field detection element is placed close to a flux concentrator for converging a flux generated by the current to be measured, and wherein an input/output terminal of the magnetic field detection element is placed on the same height of a plane compared to that of the current conductor or is placed on a plane which has a predetermined height difference compared to that of the current conductor, the manufacturing method comprising the steps of:
a step of forming a lead frame providing for an input/output terminal of the magnetic field detection element and the current conductor as one at the same time, by etching and/or pressing a single flat plate-like material, and
a step of sealing the current conductor, the lead frame, and the magnetic field detection element as one at the same time.

In the eighth aspect of the present invention, there is provided a method of manufacturing a current sensor, which comprises a magnetic field detection element on a current conductor passed by a current to be measured,
wherein the magnetic field detection element is placed close to a flux concentrator for converging a flux generated by the current to be measured, and wherein an input/output terminal of the magnetic field detection element is placed on the same height of a plane compared to that of the current conductor or is placed on a plane which has a predetermined height difference compared to that of the current conductor, the manufacturing method comprising the steps of:
a step of forming a lead frame providing for an input/output terminal of the magnetic field detection element and the current conductor as one at the same time, by etching and/or pressing a single flat plate-like material,
a step of providing a first magnetic material on a backside of the current conductor, on which side the magnetic field detection element is not located,
and a step of sealing the current conductor, the lead frame, the first magnetic material, and the magnetic field detection element as one.

In the ninth aspect of the present invention, there is provided a method of manufacturing a current sensor, which comprises a magnetic field detection element placed on a current conductor passed by a current to be measured,
wherein the magnetic field detection element is placed close to a flux concentrator for converging a flux generated by the current to be measured, and wherein an input/output terminal of the magnetic field detection element is placed on the same height of a plane compared to that of the current conductor or is placed on a plane which has a predetermined height difference compared to that of the current conductor, the manufacturing method comprising the steps of:
a step of forming a lead frame providing for an input/output of the magnetic field detection element and the current conductor as one at the same time, by etching and/or pressing a single flat plate-like material,
a step of providing a first magnetic material on a backside of the current conductor, on which side the magnetic field detection element is not located,
a step of providing a second magnetic material above the current conductor, on which side the magnetic field detection element is located,
a step of sealing the current conductor, the lead frame, the first magnetic material, the magnetic field detection element, and the second magnetic material as one at the same time.

As for the tenth aspect of the present invention, on the manufacturing method of the current sensor mentioned in the nineth aspect, here, a position of the second magnetic material may be set so as to satisfy $0.1\alpha \leq X \leq 3.6\alpha$ where $\alpha$ represents a whole length of the flux concentrator along a direction of a flux generated by the current to be measured and X represents a distance between a magnetic detecting surface of the magnetic field detection element and the second magnetic material.

As for the eleventh aspect of the present invention, on the manufacturing method of the current sensor mentioned in the seventh through tenth aspect, the detection sensitivity of the magnetic field detection element is substantially increased by reducing a width of the current conductor where the magnetic field detection element is placed on.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

Embodiment 1

Figure 1:
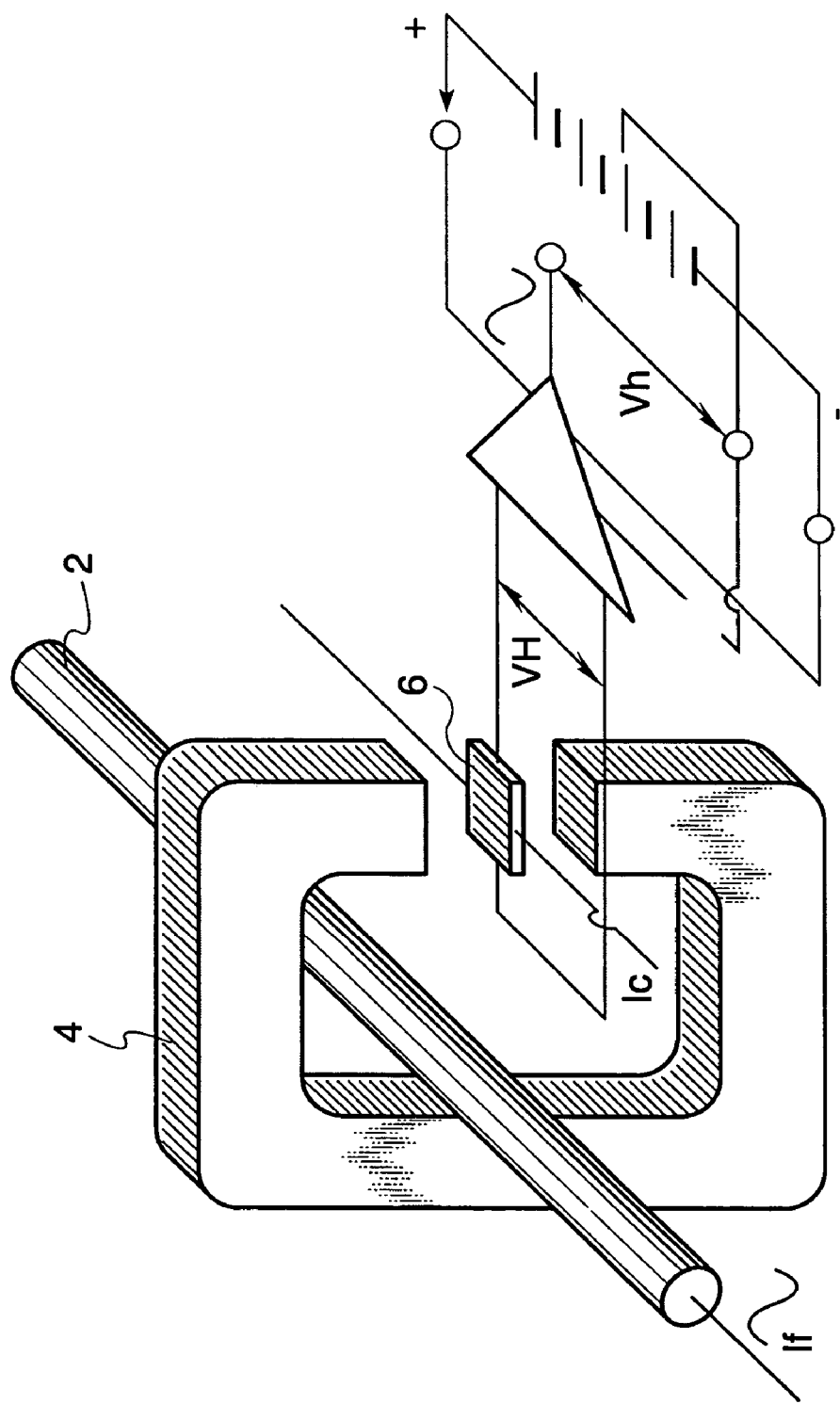
FIG. 1 is an explanatory drawing showing a conventionally known current sensor.
Figure 2A:
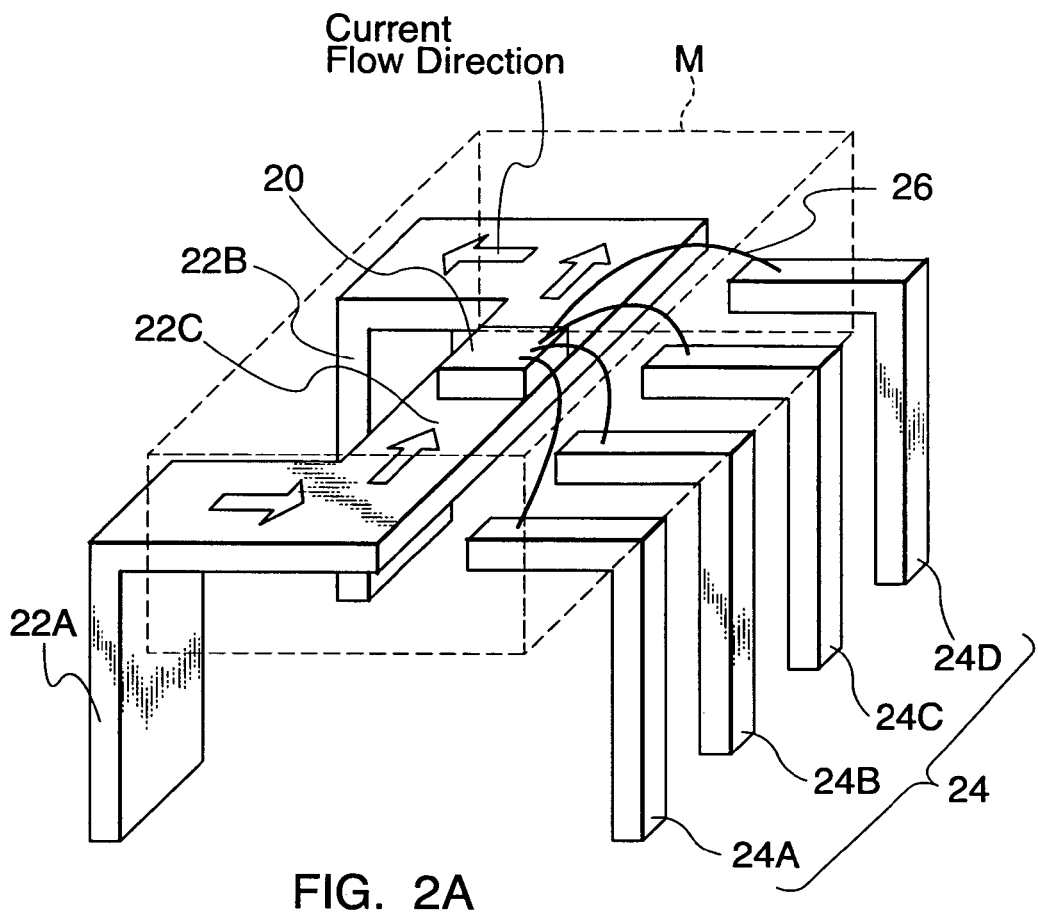
FIG. 2A is a view showing a current sensor according to embodiment 1 of the present invention.
Figure 2B:
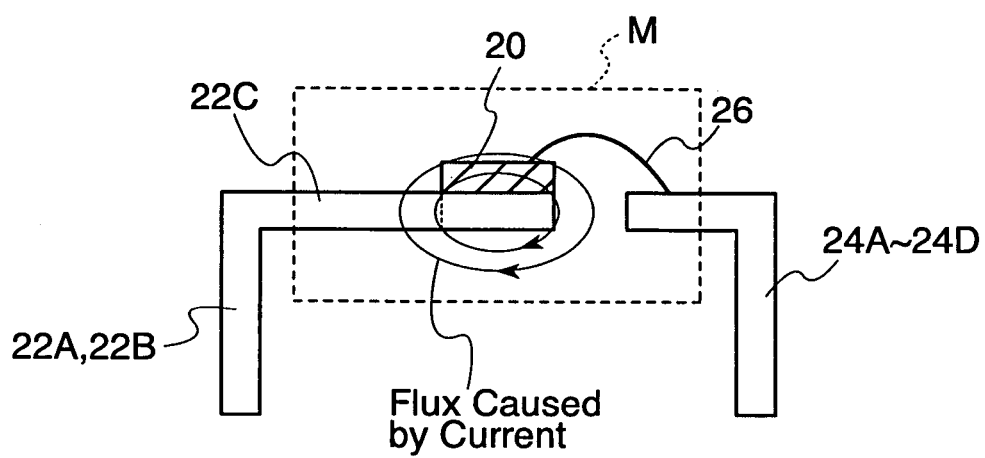
FIG. 2B is a view showing a current sensor according to embodiment 1 of the present invention.
Figure 4A:
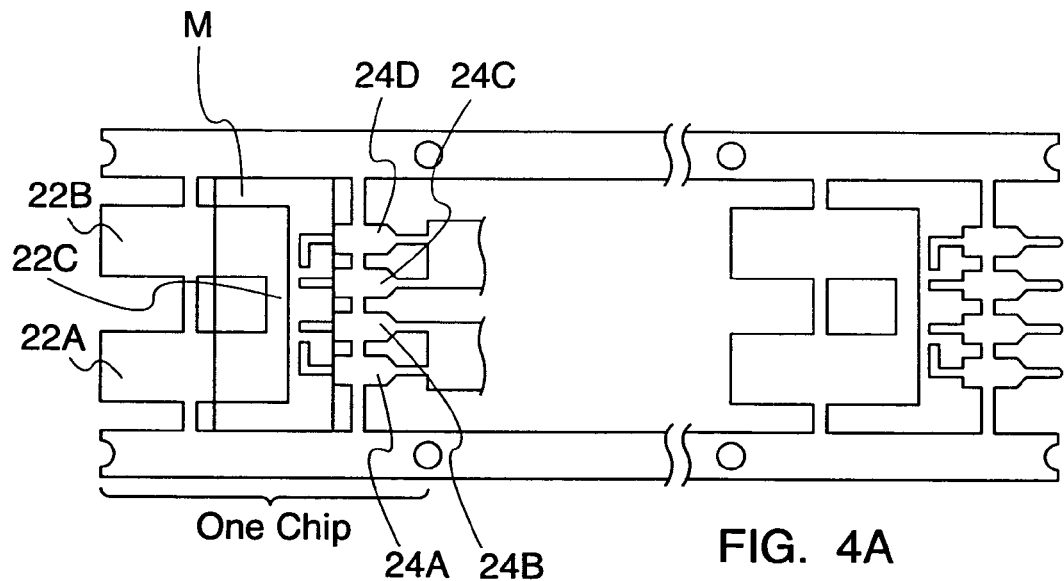
FIG. 4A is an explanatory drawing showing a manufacturing process of the magnetic field sensor chip 20.
Figure 4B:
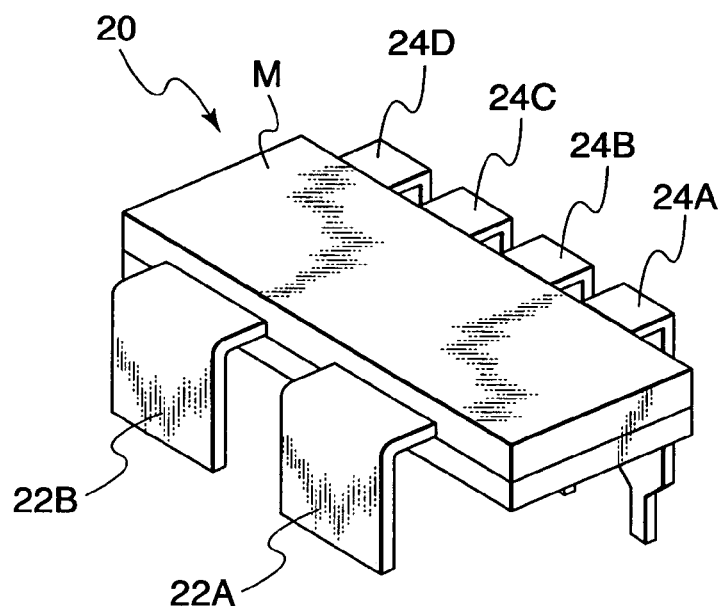
FIG. 4B is an explanatory drawing showing the manufacturing process of the magnetic field sensor chip 20.

FIG. 2A is a perspective view showing schematically the entire configuration of a current sensor employing the present invention. FIG. 2B is a view showing schematically the configuration of the current sensor shown in FIG. 2A. In these views, reference numeral 20 denotes a magnetic field sensor chip including a magnetic field detection element like a Hall element and so on, reference numerals 22A to 22C denote current conductors for applying a current to be measured, and reference numerals 24A to 24D denote lead frame terminals. Each of the lead frame terminals 24A to 24D and the current conductor 22A to 22C are formed from a single thin plate-like metal as will be discussed later (FIG. 4A and FIG. 4B). Reference numeral 26 denotes a bonding wire for connecting the lead frame terminals 24A to 24D and the magnetic field sensor chip 20. Further, reference character M denotes a part to be molded in plastics.

Figure 3A:
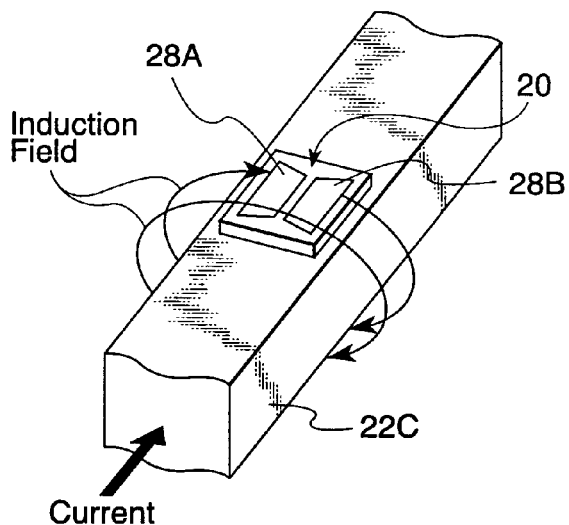
FIG. 3A is a perspective view showing a magnetic field sensor chip 20 of FIG. 2A and FIG. 2B.
Figure 3B:
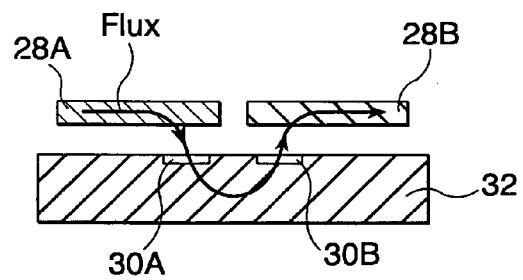
FIG. 3B is a sectional view showing the magnetic field sensor chip 20 of FIG. 2A and FIG. 2B.
Figure 3C:
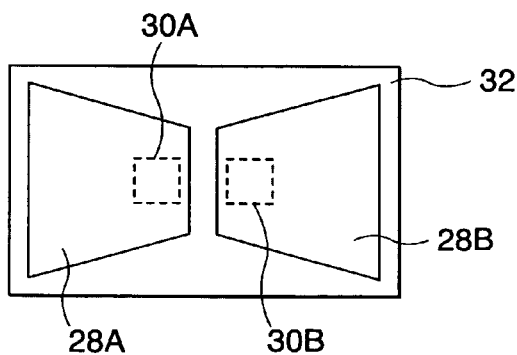
FIG. 3C is a top view showing the magnetic field sensor chip 20 of FIG. 2A and FIG. 2B.

FIGS. 3A, 3B, and 3C are, respectively, a perspective view, a sectional view, and a surface view showing the detail of a magnetic field sensor chip 20 shown in FIG. 2A. As shown in these views, the magnetic field sensor chip 20 is entirely placed on the current conductor 22C and detects the magnitude of an induction field generated by the current to be measured. On the upside of the magnetic field sensor chip 20 (that is, the farthest side from a sensor chip substrate 32), two flux concentrators 28A and 28B are placed having a predetermined interval between them. Two Hall elements 30A and 30B are placed on a region which is placed below the two flux concentrators 28A and 28B where flux density is high (that is, on the side of the sensor chip substrate 32).

As is evident from FIGS. 3A, 3B, and 3C, an induction field caused by the current to be measured passes through the magnetic field sensor chip 20 in such a way that the induction field passes though the flux concentrator 28A, the Hall element 30A, the other Hall element 30B, and the other flux concentrator 28B.

The illustrated magnetic field sensor chip 20 itself has been disclosed in US Patent Publication (U.S. Pat. No. 5,942,895: "MAGNETIC FIELD SENSOR AND CURRENT AND/OR ENERGY SENSOR", Popovic et al.) by the inventor of the present application. With the provision of the magnetic field sensor chip 20, it is possible to efficiently detect a flux looped around a surface of a current conductor (in parallel with the surface of the current conductor), thereby achieving a current sensor with high sensitivity.

FIGS. 4A and 4B are views for explaining a manufacturing process of the magnetic field sensor chip 20 shown in FIGS. 2A, 2B, 3A, 3B, and 3C. As shown in FIG. 4A, a plural set of the current conductor 22A to 22C and lead frame terminals 24A to 24D is formed at one at the same time by etching or pressing a single thin plate-like metal. As a result, it is possible to simultaneously manufacture the plural set of the current conductor 22A to 22C and lead frame terminals 24A to 24D for a plural set of chips. A processed thin piece metal which is cut out for one chip region has an appearance shown in FIG. 4B in the end. In other words, the external view of FIG. 4B is identical to FIG. 2A (perspective view), which has been already discussed.

In the current sensor mentioned in the present embodiment, the current conductor 22C passed by the current to be measured is configured so as to have the same height position of a plane compared to that of the lead frame terminals 24A to 24D, with which the terminals of the magnetic field sensor chip are connected. Or in order to perform wire bonding readily, the surface of the current conductor 22C where the magnetic field sensor chip 20 is placed on can be pressed down by approximately a thickness of the chip. Thus, as in the case that lead frames for an integrated circuit are conventionally manufactured, the conductive material passed through by the current and the lead frame terminals can be formed as one at the same time from a single flat plate-like material by using a method such as etching and/or pressing. This method achieves mass-productivity at low cost.

Embodiment Example

The following will discuss an embodiment example corresponding to FIG. 2A.

A copper plate with a thickness of 0.4 mm was used as a thin plate-like metal (FIG. 4A) to form the current conductor 22A to 22C and the lead frame terminals 24A to 24D as one. As described above, FIG. 4A shows that a plurality of chips are connected. Manufacturing in large quantity was readily performed by using completely the same process used for lead frames of a typical integrated circuit. Then the above lead frames were used to form a current sensor molded in plastics used for an integrated circuit. This is shown in FIG. 4B.

The width of the center part 22C of the current conductor placing the magnetic field sensor chip 20 thereon was about 2 mm, and the outside of the molded plastics was about 5.5 mm in width, and a maximum current of 25A could be applied continuously. The Hall ASIC shown in FIGS. 3B and 3C was applied on the magnetic field sensor chip 20. The Hall ASIC was fixed on an island of the current conductor by an insulating adhesive tape used for die bonding of an integrated circuit. As shown in FIGS. 3B and 3C, the Hall ASIC had a pair of flux concentrators (soft magnetic material thin film-like) 28A and 28B which were separated by a gap, and Hall elements were placed directly below each flux concentrator. When current flows in the current conductor 22C, a horizontal flux appears to a surface of the current conductor as shown in FIGS. 3A to 3C. The flux passes through the flux concentrator 28A on the surface of the ASIC chip, draws an arc-shaped trail over the gap of the flux concentrators, penetrates the Hall elements placed directly below the flux concentrators, and is absorbed by the other flux concentrator 28B. On the Hall elements where a flux passes, electromotive force is generated corresponding to a flux density. Since the flux density is proportional to the intensity of the current passing through the current conductor, an electromotive force proportional to the intensity of the flowing current is generated at the Hall elements, and the intensity of the current can be detected.

In this embodiment example, about 12 gauss per 1 ampere in current to be measured was generated at the Hall elements as current sensitivity.

Embodiment 2

Figure 5A:
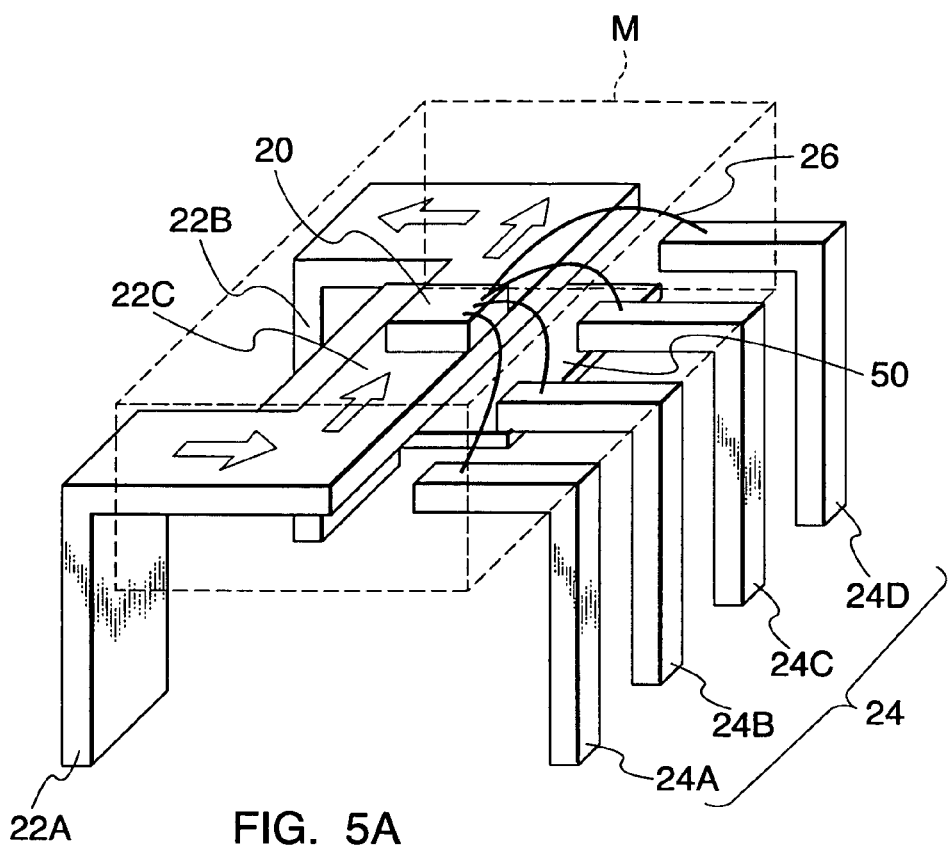
FIG. 5A is a perspective view showing a current sensor in embodiment 2 of the present invention.
Figure 5B:
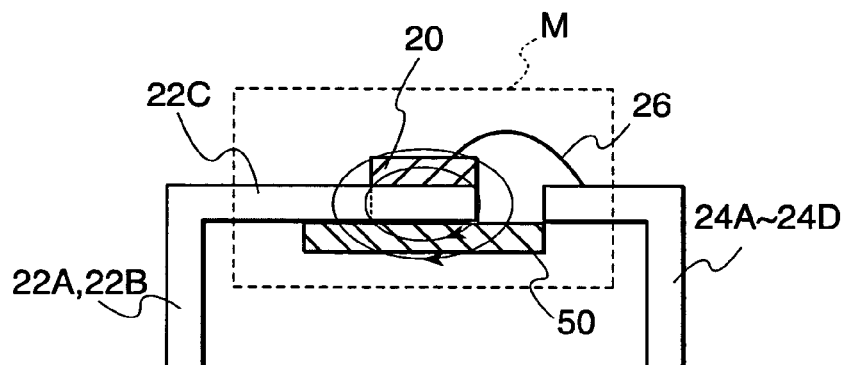
FIGS. 5B and 5C are sectional and auxiliary views respectively showing the current sensor in embodiment 2 of the present invention.

FIGS. 5A and 5B are schematical perspective views showing the entire configuration of a current sensor corresponding to another embodiment. In these views, in addition to the configuration of FIG. 2, a soft thin plate-like magnetic material 50 is bonded beneath a current conductor 22C (that is, bonded on the opposite side from a magnetic field sensor chip 20).

Figure 6A:
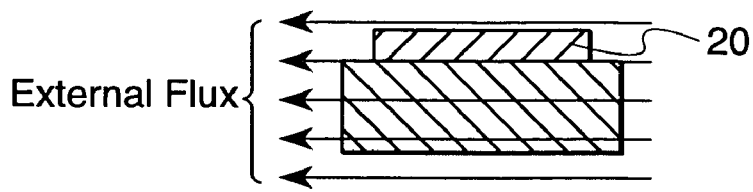
FIG. 6A is an explanatory drawing showing the function of a soft thin plate-like magnetic material (first magnetic material) 50 shown in FIG. 5A and FIG. 5B.
Figure 6B:
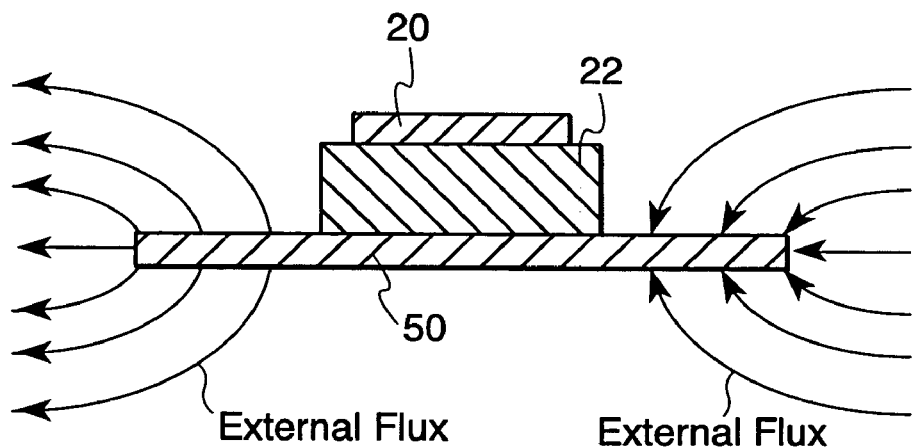
FIG. 6B is an explanatory drawing showing the function of the soft thin plate-like magnetic material (first magnetic material) 50 shown in FIG. 5A and FIG. 5B.
Figure 6C:
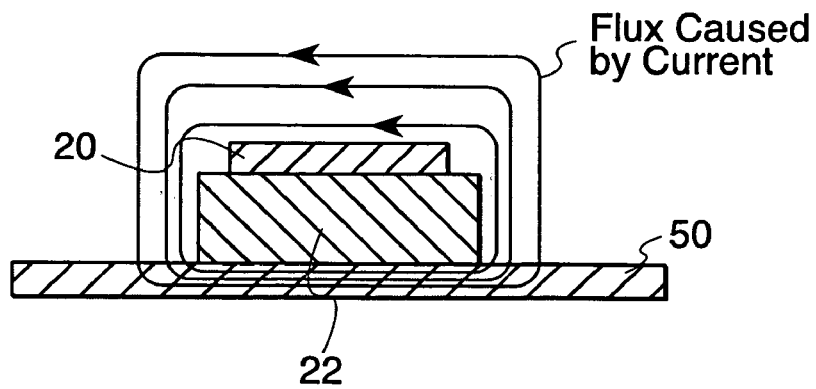
FIG. 6C is an explanatory drawing showing the function of the soft thin plate-like magnetic material (first magnetic material) 50 shown in FIG. 5A and FIG. 5B.

FIGS. 6A, 6B, and 6C are explanatory drawings showing the function of the soft, thin plate-like magnetic material 50 shown in FIGS. 5A and 5B.

As shown in FIGS. 5A, 5B, 6A, 6B, and 6C, the soft, thin plate-like magnetic material 50 with high magnetic permeability, high saturation flux density, and low coercive force is bonded on the backside of an island part 22C of the current conductor, so that the soft, thin plate-like magnetic material 50 absorbs an external flux entering from the outside of the current sensor, and that it passes through the plate 50. Thus, it is possible to reduce influence of the external flux to the sensor. Besides, the soft, thin plate-like magnetic material 50 also converges and amplifies a flux generated by the current to be measured, and thus, further improve the sensitivity of the current sensor.

Figure 7:
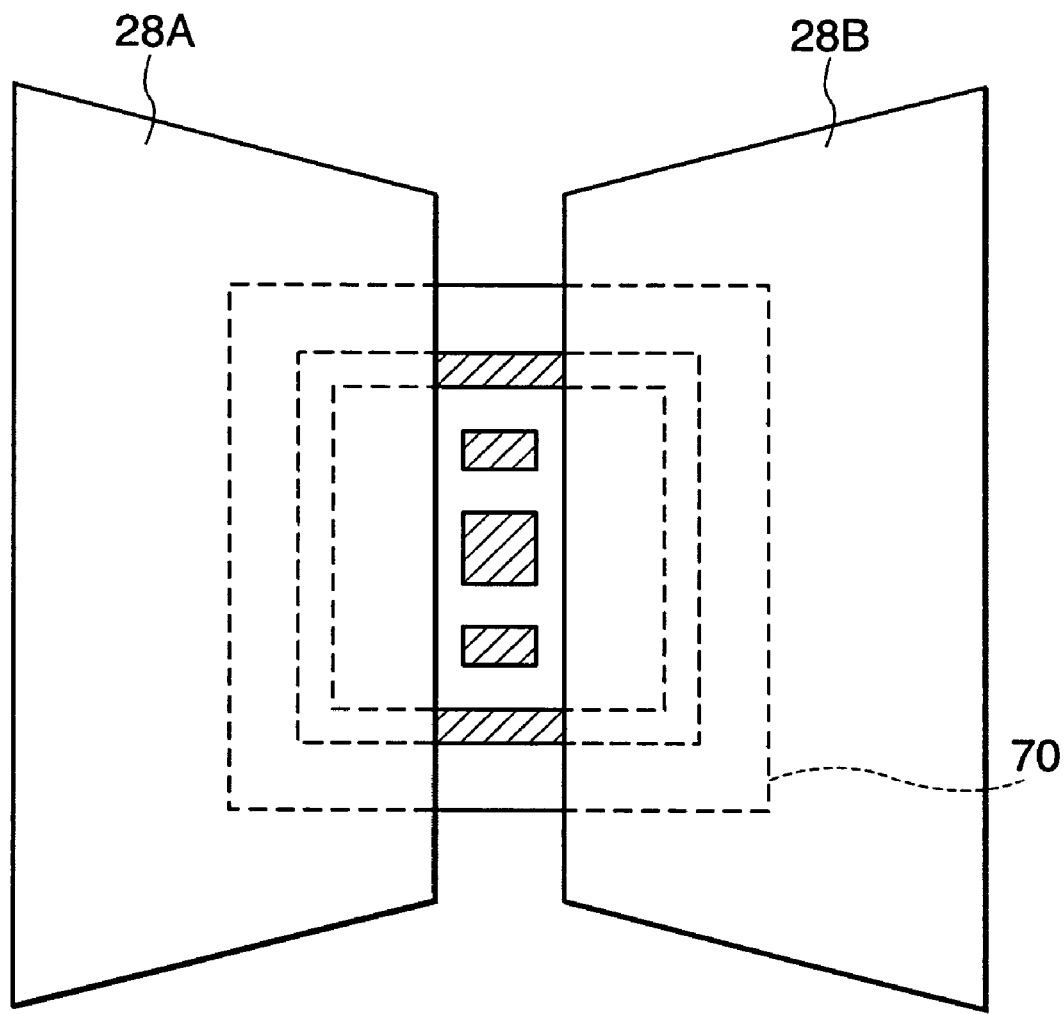
FIG. 7 is an explanatory drawing showing a magnetic field sensor chip comprising a single Hall element 70 as another embodiment of the present invention.

Additionally, in embodiments 1 and 2 described above, the two Hall elements 30A and 30B are placed below the two flux concentrators 28A and 28B. As shown in FIG. 7, a single Hall element 70 may be placed instead of the two Hall elements 30A and 30B. As shown in FIG. 7, the single Hall element 70 is placed over two flux concentrators 28A and 28B and a gap between the concentrators in this case.

The single Hall element 70 itself in FIG. 7 has been disclosed in US Patent Publication (U.S. Pat. No. 5,942,895: "MAGNETIC FIELD SENSOR AND CURRENT AND/OR ENERGY SENSOR", Popovic et al.) by the inventor of the present application.

Further, a magnetic field sensor chip is not restricted to employ a Hall element as long as preferable sensitivity is realized for a horizontal flux to a surface of the chip. Thus, a magnetoresistive element or GMR is also applicable for it.

EXAMPLE

Figure 5C:
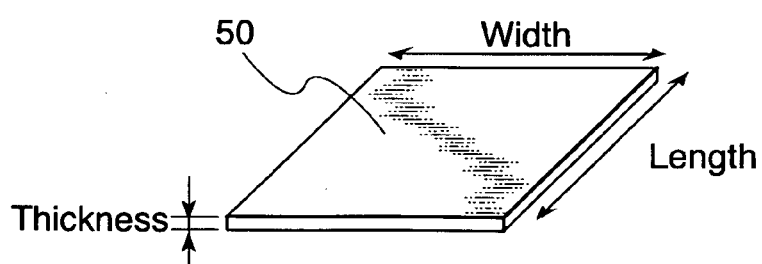

The following will discuss an embodiment corresponding to FIGS. 5A, 5B and FIG. 5C.

In this embodiment example, a soft, thin plate-like magnetic material 50 was 0.35 mm in thickness, 10 mm in length, and 7 mm in width. Then, the thin plate was bonded on the backside of a current conductor using an insulating adhesive tape which is used for bonding Hall ASIC chip onto an island described above. As a result, as compared to the case where the soft magnetic material thin plate 50 is not bonded, the sensitivity to current to be measured was improved by about 1.8 times, and the sensitivity to an external flux of FIGS. 6A and 6B was reduced to about one eighth.

Embodiment 3

Figure 8A:
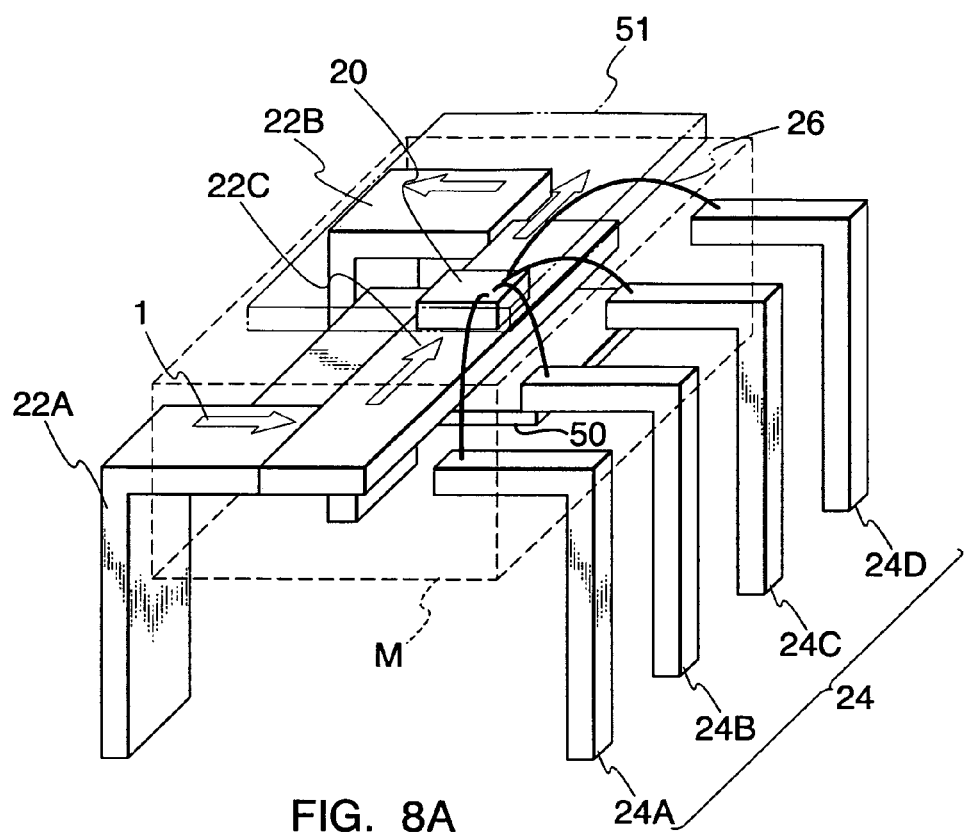
FIG. 8A is a view showing a current sensor in embodiment 3 of the present invention.

FIG. 8A is a schematical perspective view showing the entire configuration of a current sensor corresponding to embodiment 3. In embodiment 3, a second magnetic material (shield plate) 51 is placed above a magnetic field sensor chip 20 which is placed on an island 22C of a current conductor, in addition to the configuration of FIG. 5A.

Figure 8B:
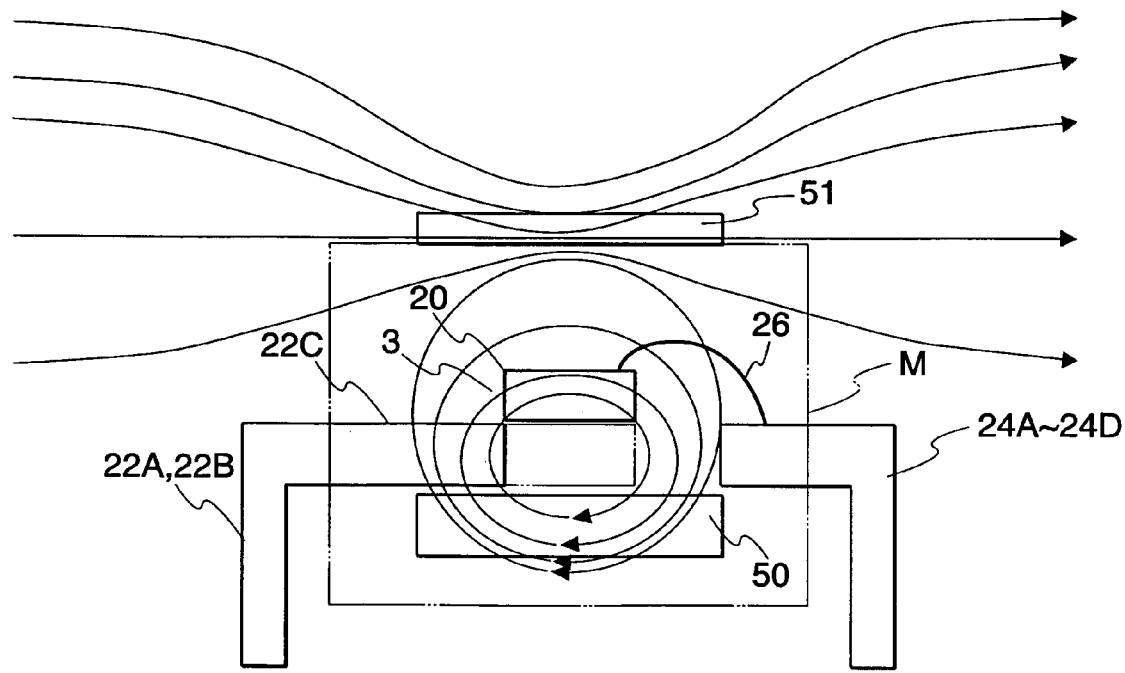
FIG. 8B is a view showing a current sensor in embodiment 3 of the present invention.

FIG. 8B is an explanatory drawing showing the function of the second magnetic material 51 shown in FIG. 8A. The magnetic material (shield plate) with high magnetic permeability, high saturation flux density, and low coercive force is placed over the magnetic field sensor chip 20, so that a disturbance flux coming from the outside is absorbed by the second magnetic material 51 (shield plate) and passes through the material 51. Hence, it is possible to reduce the influence of a disturbance flux. In FIG. 8B, a representation indicating the magnetic shielding effect caused by the first magnetic material 50 (cf. FIG. 6B) protecting a current sensor from a disturbance flux is not depicted.

Figure 9:
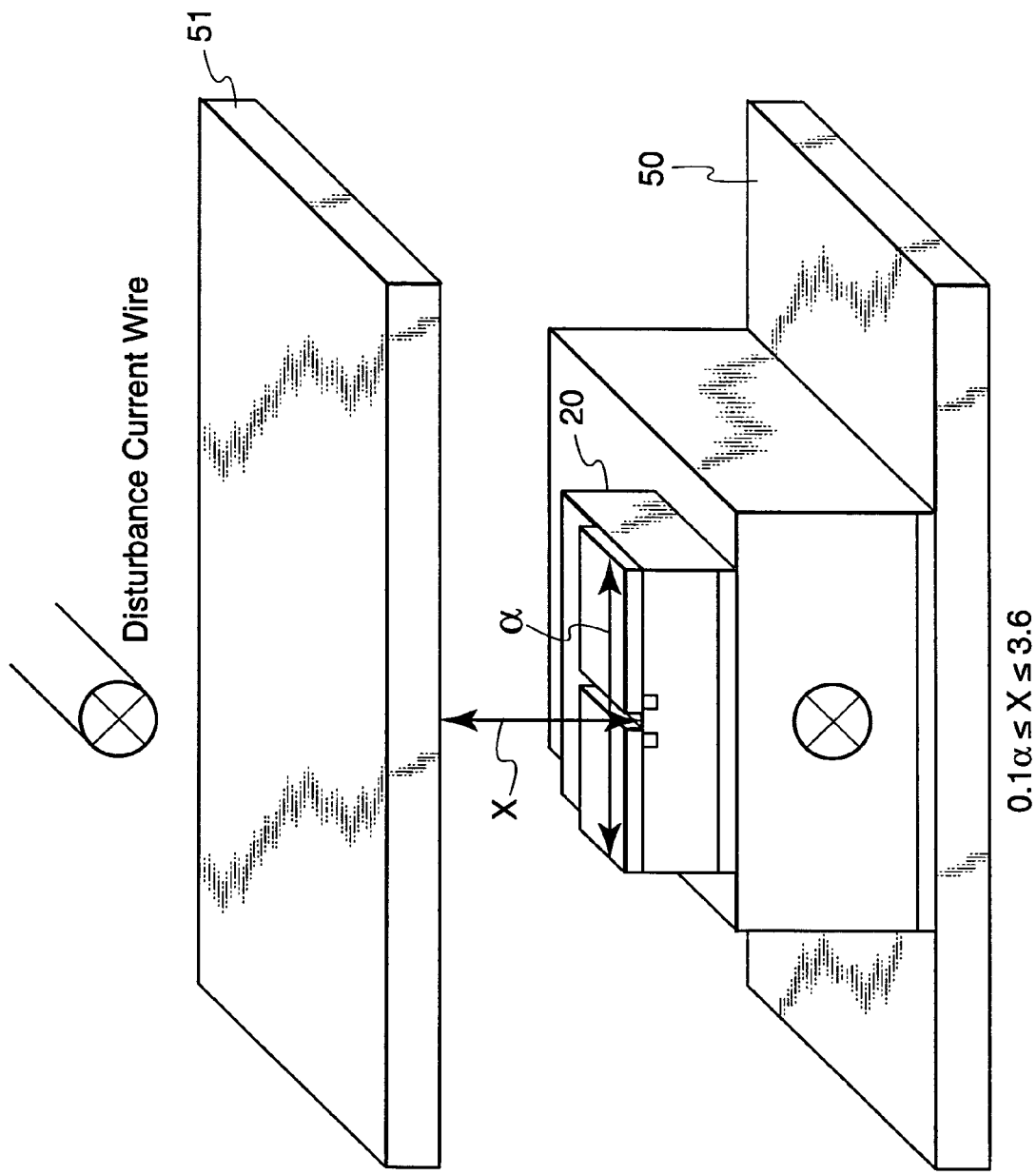
FIG. 9 is a view showing the current sensor in embodiment 3 of the present invention.
Figure 10:
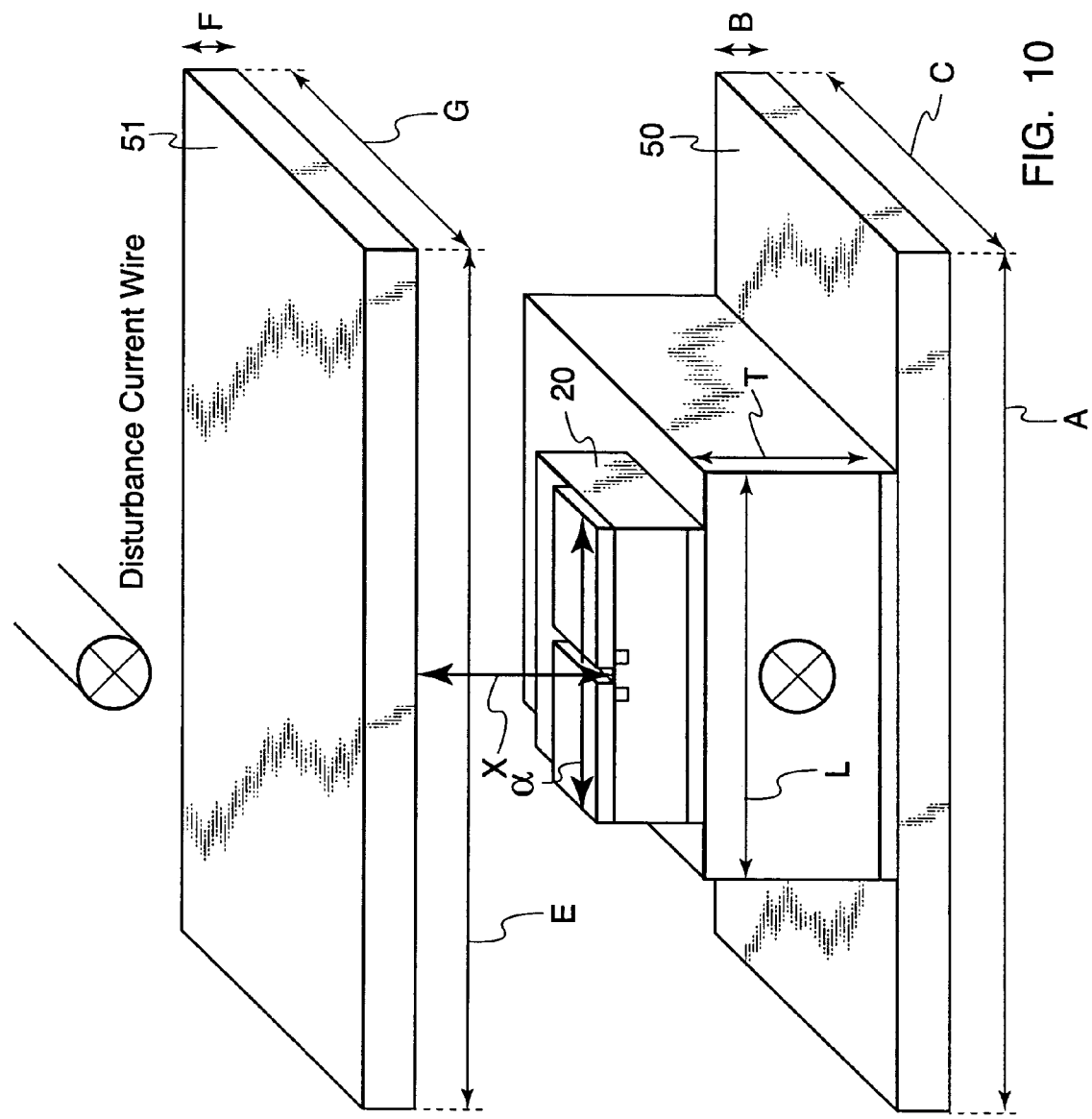
FIG. 10 is a view showing the current sensor in embodiment 3 of the present invention.

FIGS. 9 and 10 are explanatory drawings emphasizing the main parts of embodiment 3. Properly speaking, FIGS. 9 and 10 depict a section view cut in centers, but character references C and G denote a whole length of a magnetic plate (which is twice the length from a center to an edge).

In FIG. 9, a placement of the magnetic detection surface of a magnetic field detection element using Hall elements or the like is substantially the same height position of the bottoms of the flux concentrators. Assume that a distance between the position (the magnetic detection surface of a magnetic field detection element) and the bottom of the second magnetic material 51 is X. Assume that a total length of the flux concentrators including two flux concentrators 28A, 28B and a gap is α along the flowing direction of a measuring magnetic field generated by the current to be measured.

In FIGS. 8B and 9, in order to obtain sufficient detecting sensitivity while maintaining the magnetic shielding effect, a region satisfying $0.1\alpha \leq X \leq 3.6\alpha$ is effective.

The singular region is practically an area satisfying the above condition, $0.1\alpha \leq X \leq 3.6\alpha$. In the singular region, measuring magnetic field forms a magnetic path passing through the first magnetic material and the magnetic concentrator. In the region, the second magnetic material (shield plate) 51 draws an external disturbance (interference) magnetic flux mainly, rather than the measuring flux caused by the current to be measured.

The reason why a lower limit value is $0.1\alpha$ will be specifically discussed later in accordance with FIGS. 12A to 12C. Further, the reason why the upper limit value is $3.6\alpha$ will be discussed later in detail in accordance with FIGS. 13A to 13C. In this singular region, it is possible to obtain remarkable shielding effect keeping the magnetic amplification factor of the sensor to be equal or greater than 1.

Besides, in FIGS. 8A and 8B, a placement of the first magnetic material 50 and the second magnetic material 51 is not restricted to the inside of the molded resin. These may be placed inside or outside of the molded resin, or on the surface of it.

Figure 11:
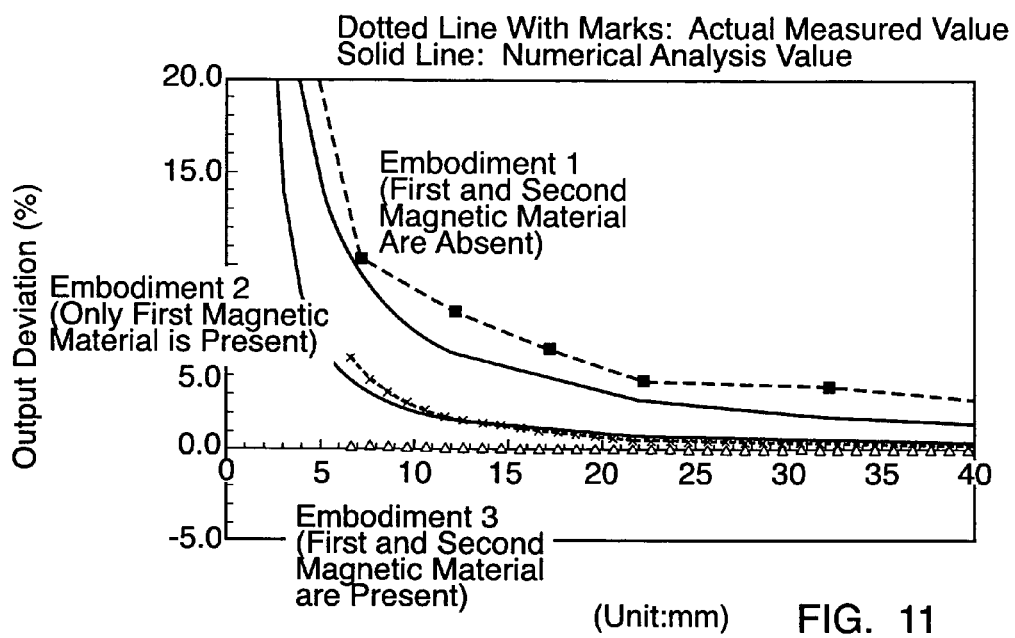
FIG. 11 is a characteristic diagram showing the magnetic shielding effect when a disturbance current wire is vertically moved over the current sensor in the embodiment of FIG. 8A, FIG. 8B, FIG. 9 and FIG. 10.

FIG. 11 shows numerical analysis results indicating magnetic shielding effect of the embodiment shown in FIGS. 8A, 8B, 9, and 10, when a disturbance current wire is moved vertically over the current sensor. In FIG. 10, the second magnetic material 51 has a thickness of F=0.35 mm, a length of G=10 mm, and a width of E=7 mm. The first magnetic material 50 has a thickness of B=0.35 mm, a length of C=10 mm, and a width of A=7 mm.

In this analysis, the disturbance current wire was placed above the second magnetic material 51 so as to cross above the center of the magnetic field sensor chip, and moved vertically. This case brings the largest disturbance to a magnetic field to be measured.

As reference, the magnetic shielding effects of "embodiment 1" and "embodiment 2" are also shown in FIG. 11. Further, in addition to results indicated by a numerical analysis (solid line), actual measurement values (dotted line with marks) are indicated.

In actual measurements, output values of the current sensor were read by a commercial digital volt meter. Since it was necessary to compute detection sensitivity to calculate the extent of disturbance, the current to be measured and disturbance current each had a base quantity of 25 Ampere. The disturbance current wire had a diameter of 3 or 5 mm.

The horizontal axis of FIG. 11 represents a distance X (unit: mm) between the center of the disturbance current wire and the magnetic detection surface of the Hall element. A distance between a package surface and the Hall element was calculated based on a design size determined when the package was prototyped. The vertical axis of FIG. 11 represents an output deviation (%). The detecting sensitivity [mV/A] with no disturbance and the detecting sensitivity [mV/A] corresponding to a distance to the disturbance current wire were computed, and "deviation of sensor outputs" resulting from an disturbance flux were computed based on the calculated detection sensitivities.

A commercial magnetic field analysis tool was used for the numerical analysis. It was assumed that ideal DC line current flows in the disturbance current wire. Then, for both cases where disturbance is absent and present, a flux crossing the magnetic detection surface of a Hall element was computed by the numerical analysis, an average flux density over the magnetic detection surface was computed as post processing, and "deviation of sensor outputs" resulting from disturbance were computed based on the results.

As shown in FIG. 11, the results of numerical analyses meet well with the actual measurement values. With regard to a region for a small value of X, it is found that errors in relation to disturbance are remarkably reduced in the order of embodiment 1, embodiment 2, and embodiment 3. When the disturbance current wire is placed close to the upper surface of the prototype package, an output deviation of the sensor is 1% or less in embodiment 3. It is necessary to accomplish sufficient magnetic shielding effect while keeping a certain value of the sensitivity. Thus, practical distance X satisfying both the sensitivity and the magnetic shielding effect will be determined by adjusting the height position of placing the second magnetic material. A width of the current conductor (ie. reference numeral L) corresponds to an intensity of induced magnetic field caused by the current to be measured. $\alpha$ corresponds to detection of induced magnetic field. Sizes of the second magnetic material (ie. width E and thickness F) affect an influence to an intensity of the induced magnetic field caused by the current to be measured.

A width L of the current conductor, total length $\alpha$ of two concentrators with an air gap, and sizes E and F of the second magnetic material closely placed to the magnetic sensor chip 20 containing the magnetic concentrator, are important to form a magnetic path between the flux concentrator and the first magnetic material. A magnetic field analysis is done on distance X for each combination of L, $\alpha$, E, F. In the analysis described below, the height (T=0.4 mm) of a conductor, the distance between the magnetic field detection element and a center of the current conductor, the size (width A=7 mm, thickness B=0.35 mm) of the first magnetic material 50, and the distance between the magnetic detection surface and the upper surface of the first magnetic material are kept constant.

To begin with, we determined the lower limit value of the singular region as follows.

Figure 12A:
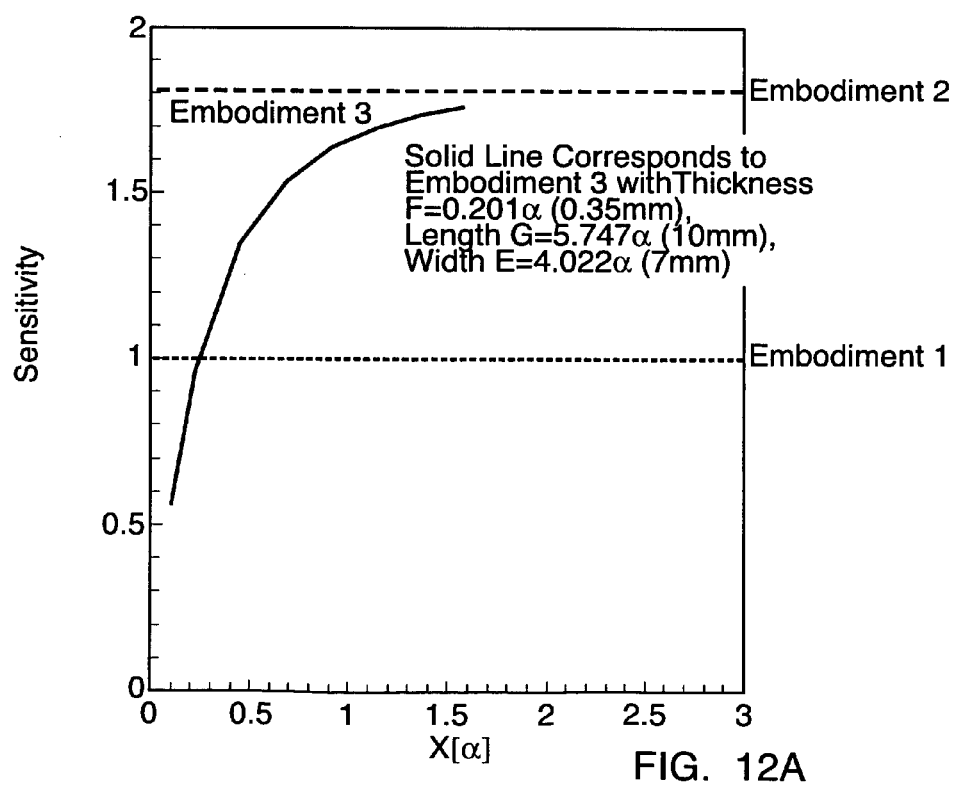
FIG. 12A is a characteristic diagram showing a lower limit value of a singular region of embodiment 3.
Figure 12B:
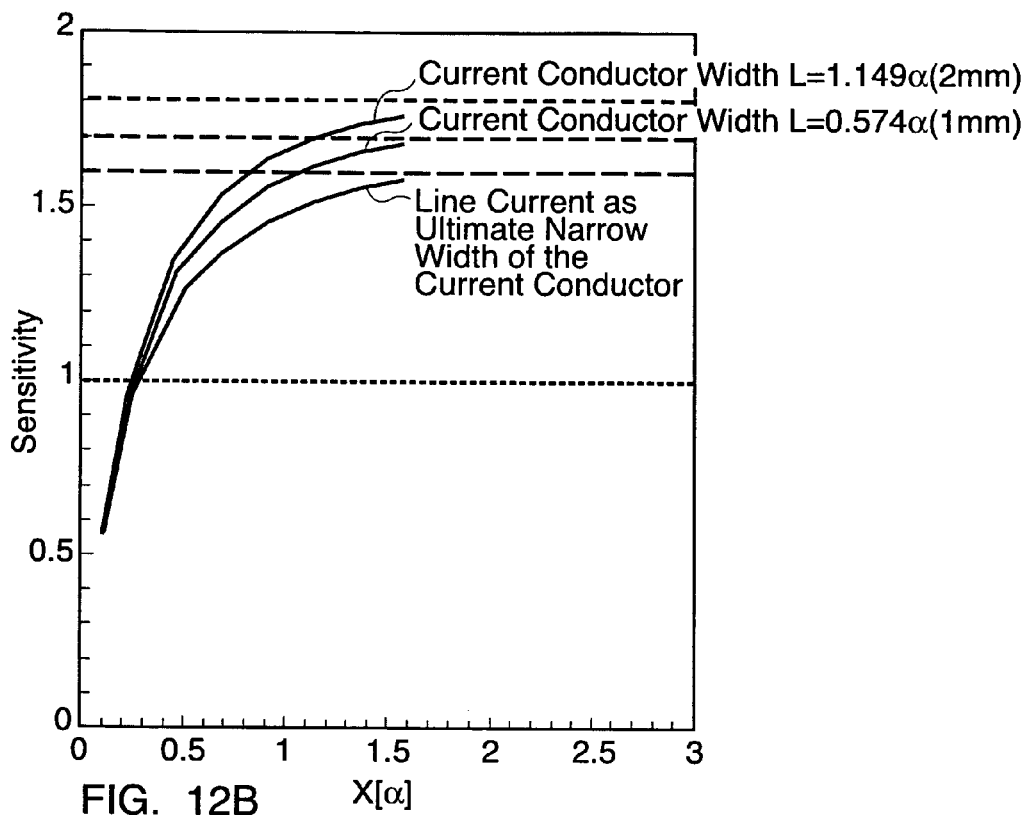
FIG. 12B is a characteristic diagram showing a lower limit value of the singular region of embodiment 3.
Figure 12C:
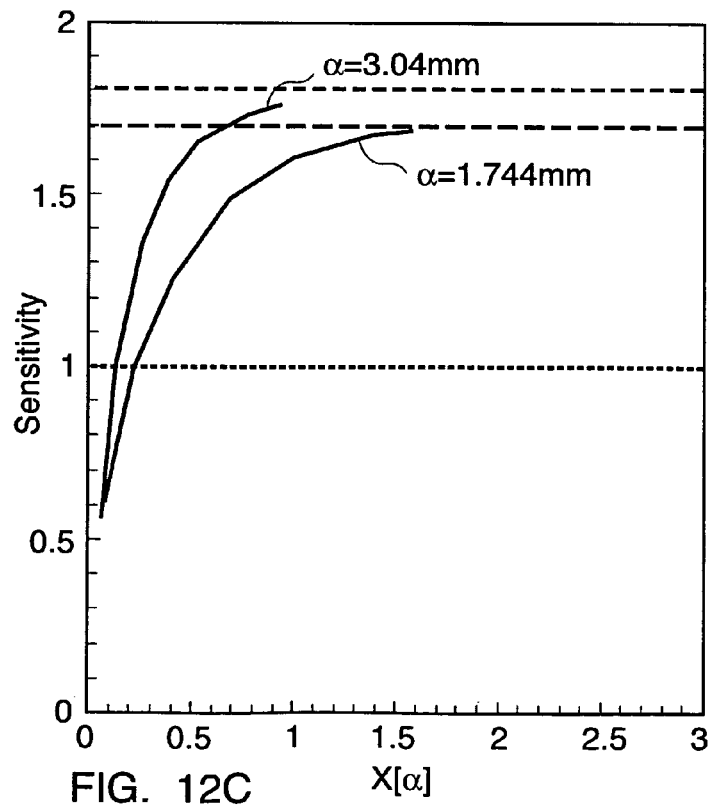
FIG. 12C is a characteristic diagram showing a lower limit value of the singular region of embodiment 3.

FIGS. 12A, 12B, and 12C show sensitivity curves which are computed by a magnetic field analysis tool using a magnetic circuit model employed for the numerical calculation of FIG. 11. To be more concrete, sensitivity characteristics is shown in FIG. 12A for sizes (width E, thickness F) of the second magnetic material 51, and is shown in FIG. 12B for the width L of the current conductor, and is shown in FIG. 12C for a total length $\alpha$ of the flux concentrator with a gap (cf. FIG. 10). The horizontal axis represents a distance X (unit: $\alpha$) between the bottom (or base) of the second magnetic material 51 and the magnetic detection surface of the Hall elements. The vertical axis represents relative sensitivity for distance X on (an assumption that sensitivity is 1 when the first magnetic material 50 and the second magnetic material 51 are absent (Embodiment 1: FIG. 2A).

In FIG. 12A, parameter values were fixed as total length $\alpha$=1.74 mm of the magnetic concentrator, a width L=1.149$\alpha$ (2 mm) of the current conductor, and a height T=0.229$\alpha$ (0.4 mm) of the conductor (FIG. 10). The first magnetic material 50 had a thickness of B=0.201$\alpha$ (0.35 mm), a length of C=5.747$\alpha$ (10 mm), and a width of A=4.022$\alpha$ (7 mm) (FIG. 10). The second magnetic material 51 had a thickness of F=0.201$\alpha$ (0.35 mm), a length of G=5.747$\alpha$ (10 mm), and a width of E=4.022$\alpha$ (7 mm) (FIG. 10). The sensitivity characteristics of this case are indicated by a solid line. Further, F was set as F=0.0287$\alpha$ (0.05 mm) to F=0.574$\alpha$ (1 mm) and E was changed from E=1.149$\alpha$ (2 mm), E=2.298$\alpha$ (4 mm), E=4.022$\alpha$ (7 mm), and E=4.885$\alpha$ (8.5 mm). Trend of those sensitivity characteristics were not so much different from those of the solid line thickness F=0.201$\alpha$ (0.35 mm), the length G=5.747α (10 mm), and the width E=4.022α (7 mm). (So those are not shown in FIG. 12A).

In FIG. 12A, a dotted line on relative sensitivity of 1 corresponds to "embodiment 1", and a dotted line around relative sensitivity of 1.8 corresponds to "embodiment 2". A solid line corresponds to "embodiment 3" in which the thickness is F=0.201α (0.35 mm), the length is G=5.747α (10 mm), and the width is E=4.022α (7 mm). When the width E increases, absolute sensitivity tends to decrease. Although the sensitivity decreases with increasing of the width E, the changing rate becomes small and hardly varies from about the width of E=2.298α (4 mm) (not shown in FIG. 12A). Moreover, even when the thickness F is varied, the change is very small (not shown in FIG. 12A).

In the example of FIG. 12A, the detection sensitivity is 1 when X is about 0.23α. In the case where the second magnetic material 51 was placed on the upper surface of the prototype package, X was 0.681α and the detection sensitivity was 1.53.

FIG. 12B shows sensitivity characteristics when the current conductor decreases in width.

In FIG. 10, basic configuration is that α=1.74 mm and the width L=1.149α (2 mm) of the current conductor. Further, the first magnetic material 50 had a thickness of B=0.201α (0.35 mm), a length of C=5.747α (10 mm), and a width of A=4.022α (7 mm). The second magnetic material 51 had a thickness of F=0.201α (0.35 mm), a length of G=5.747α (10 mm), and a width of E=4.022α (7 mm).

Three patterns of line current were computed for widths L=1.149α (2 mm), L=0.574α (1 mm), and L=ideal line width (as an ultimate narrow width) of the current conductor. The height T of the current conductor is constant (0.4 mm), when L=2 mm, 1 mm. As an ultimate shape of the hair-thin current conductor, we considered about ideal line current in addition. Assuming that sensitivity is 1 at the width L=1.149α (2 mm) of the current conductor, the absolute sensitivity in embodiment 2 is increased by 1.26 times at L=0.574α (1 mm) and increased by 1.37 times in the case of ideal line current. In FIG. 12B, the relative sensitivity for each width L was plotted in solid lines on a same scale. Horizontal scale is distance X. Sensitivity for each width L of the current conductor in embodiment 1 is used as standard value of "1".

Dotted lines around the relative sensitivities, 1.8, 1.7, and 1.6 represent respectively sensitivities for width L=1.149α (2 mm), L=0.574α (1 mm), L=ideal line of the current conductor in embodiment 2.

If the width of the current conductor is reduced, the intensity of the measuring magnetic field is increased.

In the present example, relative sensitivity=1 was obtained around X=0.23α in any case.

FIG. 12C shows sensitivity characteristics when the entire length α of the flux concentrator is increased.

In this example, α=3.04 mm. In comparison to the α=3.04 mm, the characteristics in α=1.74 mm is also depicted. In this case, a basic configuration is that the width of the current conductor is L=1 mm, and that the thickness is B=0.35 mm, the length is C=10 mm, and the width is A=7 mm for the first magnetic material 50, and that the thickness is F=0.35 mm, the length is G=10 mm, and the width is E=7 mm for the second magnetic material 51.

The absolute sensitivity in "embodiment 1" (cf. FIGS. 2A and 2B) was relatively increased by 2.4 times at α=3.04 mm, assuming that sensitivity is 1 at the entire length α=1.74 mm of the flux concentrator. In the present example, relative sensitivity for each α was plotted in a solid line on the same drawing, assuming that sensitivity for each α in embodiment 1 is standard value of "1". Horizontal axis is the distance X. Dotted lines plotted at about 1.7 and 1.8 in relative sensitivity represent sensitivities corresponding to increasing of the entire length α of the flux concentrator in embodiment 2.

In the case of α=3.04 mm, the width of the current conductor is set as L=0.328α (1 mm). For the first magnetic material 50, it is set as that thickness B=0.115α (0.35 mm), the length C=3.289α (10 mm), and the width A=2.302α (7 mm). The sizes in the second magnetic material 51 are identical to those of the first magnetic material 50.

In FIG. 12C, relative sensitivity=1 means sensitivity in embodiment 1. In FIG. 12C, for relative sensitivity=1, a minimum value of X is around X=0.13α. In addition to α=3.04 mm, if E=1.315α (4 mm), F=0.0164α (0.05 mm) are set, the sensitivity may be increased. It is expected that the lower limit of α becomes small. According to the numerical analysis, lower limit of X was 0.13α. From these results, we can say that practical lower limit is 0.1α.

The upper limit of the singular region will be determined as follows.

Figure 13A:
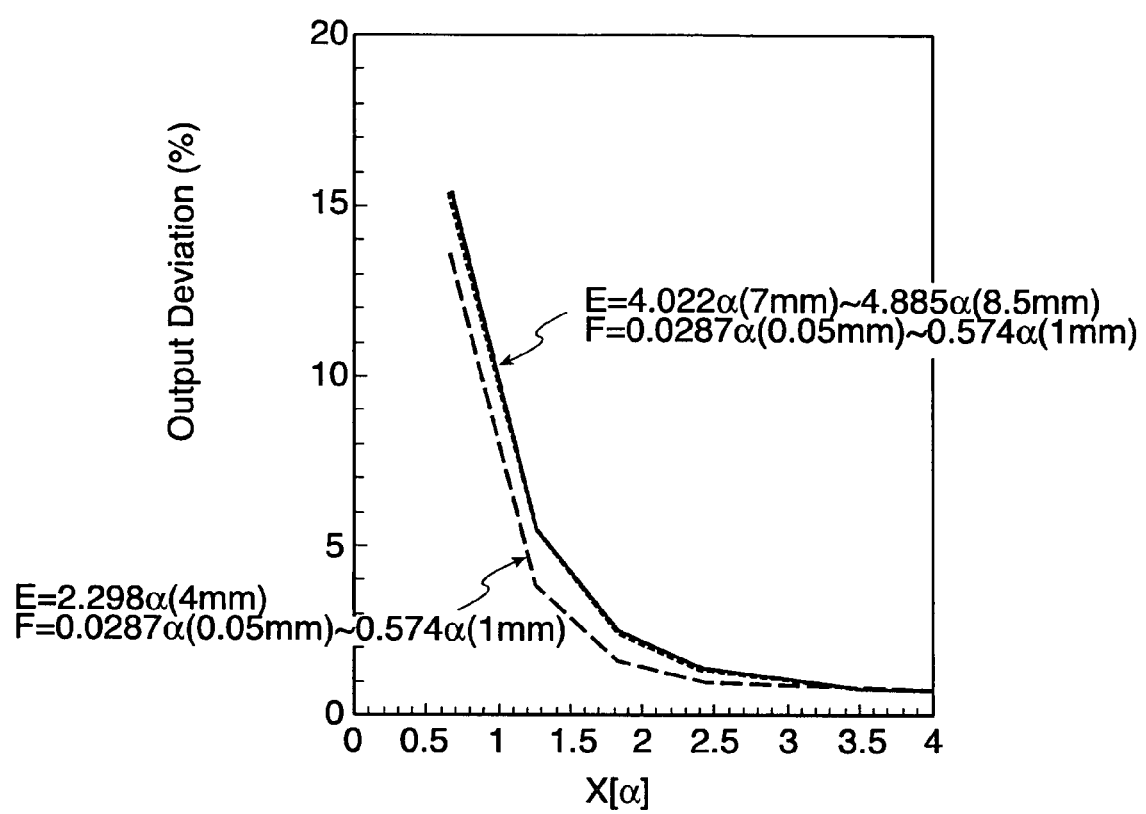
FIG. 13A is a characteristic diagram showing an upper limit value of the singular region of embodiment 3.
Figure 13C:
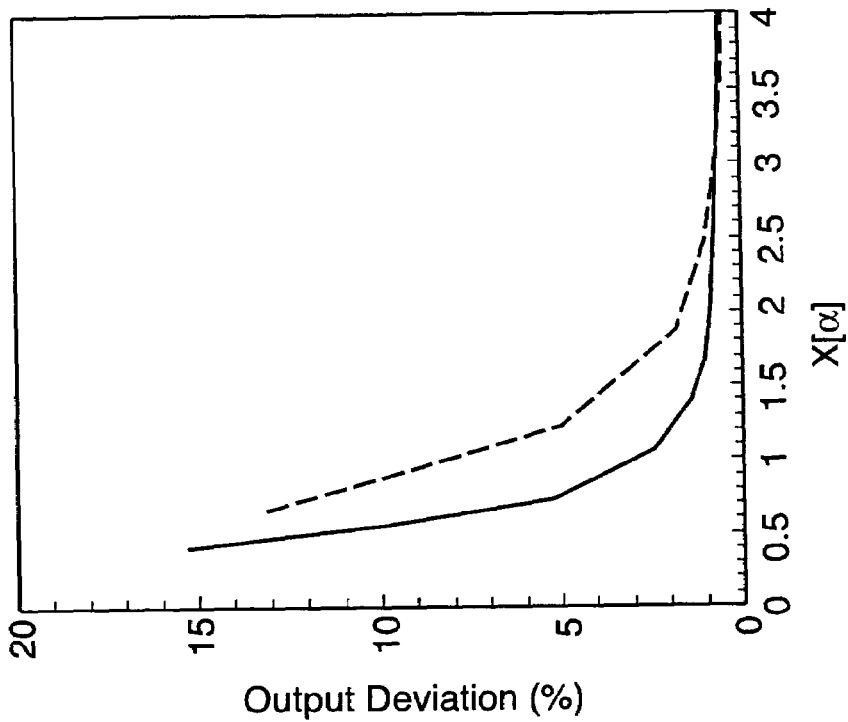
FIG. 13C is a characteristic diagram showing an upper limit value of the singular region of embodiment 3.
Figure 13B:
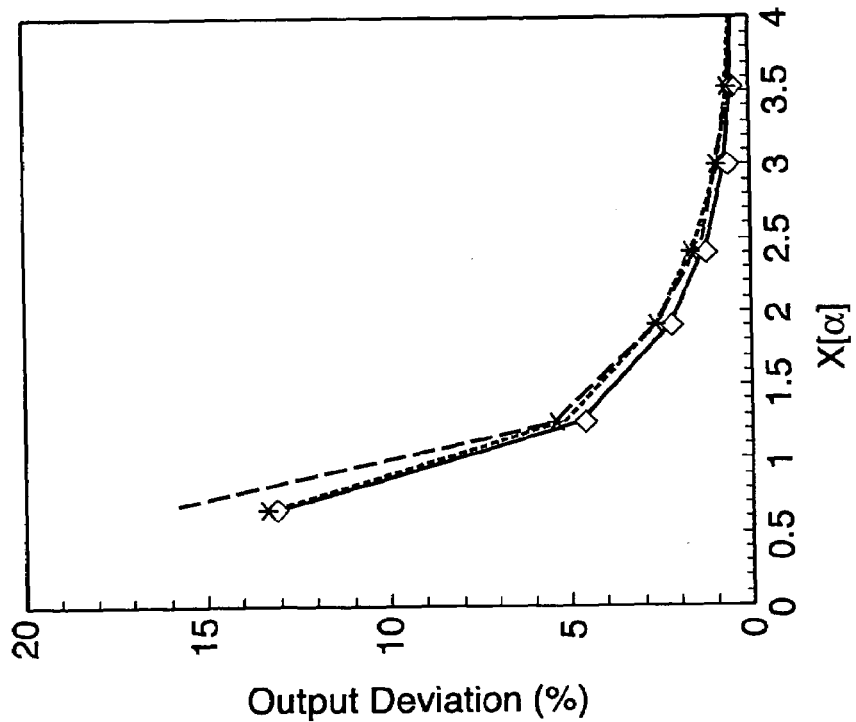
FIG. 13B is a characteristic diagram showing an upper limit value of the singular region of embodiment 3.

In order to examine the shielding effect caused by the second magnetic material 51, a magnetic field analysis was done using the magnetic circuit model applied in the numerical analysis as shown in FIG. 11. FIGS. 13A, 13B and 13C show the results.

The disturbance current wire is placed in a constant position, about 22 mm far away from the magnetic detection surface, and the second magnetic material 51 is vertically moved between the magnetic field sensor chip 20 and the disturbance current wire. In these drawings, the horizontal axis represents a distance X (unit: α) between the base (bottom) of the second magnetic material 51 and the magnetic detection surface of the Hall elements. The vertical axis represents the relative sensitivity for each case. The horizontal axis is a distance X. Assuming that a flux density (that is, sensitivity) passing through the magnetic detection surface of the Hall element in "embodiment 2 which comprises the first magnetic material 50 is as standard value of "1" (FIGS. 5A and 5B)". To be precise, the relative sensitivity (ie. output deviation) is shown, for a combination of each shape (size) of the flux concentrators, each shape (size) of the current conductors, and each shape (size) of the magnetic materials. Sensor sensitivity is based on a density of a flux passing through the magnetic detection surface of the magnetic field detection element (a flux density, that is sensitivity, in "embodiment 2" is treated as "1").

The flux density on the magnetic detection surface is computed as a combined value of a disturbance flux generated by disturbance current and a measuring magnetic field generated by the current to be measured. If the second magnetic material is very close to the magnetic detection surface, a drawing phenomenon of a flux caused by the second magnetic material 51, that is, an intake effect of a flux appears markedly. At this moment, a flux does not go mainly toward the magnetic detection surface.

In addition to X, as is evident from FIG. 13A, it is understood that the drawing degree of a flux varies corresponding to a change in the length E and thickness F of the second magnetic material 51. When a parameter is changed, a drawing difference of a flux (that is, a difference between values of curves on the vertical axis) corresponds to a difference in the shielding effect.

In FIG. 13A, the following parameters are kept constant as α=1.74 mm, a width L=1.149α (2 mm) of the current conductor, and a height T=0.229α (0.4 mm) of the conductor. The first magnetic material 50 had a thickness of B=0.201α (0.35 mm), a length of C=5.747α (10 mm), and a width of A=4.022α (7 mm). Thickness F of the second magnetic material 51 are ranged from F=0.0287α (0.05 mm) to 0.574α (1 mm), the width are ranged in E=2.298α (4 mm), E=4.022α (7 mm), and E=4.885α (8.5 mm). Sensitivity changes for these are shown in FIG. 13A. When the size is larger than E=2.298α (4 mm), the difference between each drawing effect can be ignored, thus, substantially no difference is found in the magnetic shielding effect. A dotted line is used for E=2.298α (4 mm). A solid line is used for more than E=2.298α (4 mm). As is evident from FIG. 13A, the magnetic shielding effect becomes apparent at or below 3.6α.

FIG. 13B shows the magnetic shielding effect when the width of the current conductor is reduced. The following parameters are kept constant as α=1.74 mm, the thickness B=0.201α (0.35 mm), the length C=5.747α (10 mm), and the width A=4.022α (7 mm) for the first magnetic material 50. For the second magnetic material 51, the thickness F=0.201α (0.35 mm), the length G=5.747α (10 mm), and the width E=4.022α (7 mm).

Three patterns of current conductor were used for the width L=1.149α (2 mm), L=0.574α (1 mm), and L=ideal line current conductor as an ultimate narrow width. The height T of the current conductor is constant (0.4 mm), wherein L=2 mm, 1 mm. As an ultimate shape of the hair-thin current conductor, we considered about the ideal line current in addition. The center position of the line current is the same as the center position of the current conductor that has the actual area of the cross section.

Supposing that the sensitivity is 1 for the width L=1.149α (2 mm) of the current conductor. The absolute sensitivity in "embodiment 2 (FIGS. 5A and 5B)" is increased by 1.26 times for L=0.574α (1 mm) and increased by 1.37 times at the ideal line current.

In FIG. 13B, the relative sensitivities for each current width are indicated by solid lines and a dotted line on the same drawing, wherein the flux density (sensitivity) in embodiment 2 for each current width is "1". The horizontal axis is the distance. The dotted line indicates the characteristics of L=1.149α (2 mm), the solid line with rhombus marks indicates the characteristics of L=0.574α (1 mm), and the solid line with * marks indicates the characteristics of the ideal line current.

As is evident from FIG. 13B, when the intensity of a magnetic field is increased by reducing the width of the current conductor, the magnetic shielding effect becomes apparent at or below X=3.6α.

FIG. 13C shows a magnetic shielding effect which appears when the entire length α of the flux concentrator is enlarged. In this case, the position of the disturbance current wire is positioned in constant about 22 mm above the magnetic detection surface of the Hall elements.

Parameters are kept constant as the width L=1 mm for the current conductor, the thickness B=0.35 mm, the length C=10 mm, and the width A=7 mm for the first magnetic material 50, and the thickness F=0.35 mm, the length G=10 mm, and the width E=7 mm for the second magnetic material 51.

In FIG. 13C, relative sensitivity is indicated by a solid line and a dotted line, wherein sensitivity for each a in embodiment 2 is treated as standard value of "1". Horizontal axis is the distance X. The dotted line indicates characteristics of α=1.74 mm and the solid line indicates characteristics of α=3.04 mm.

In the case of α=3.04 mm, the width of the current conductor is set as L=0.328α (1 mm), and the first magnetic material 50 is represented by a thickness B=0.115α (0.35 mm), a length C=3.289α (10 mm), and a width A=2.302α (7 mm).

And, in addition to the configuration mentioned above, the cases of E=1.315α (4 mm) and F=0.0164α (0.05 mm) are also checked. This upper limit of X was less than 3.6α. It turned out that the upper limit of X is 3.6α.

As is evident from FIG. 13 C, maximum magnetic shielding effect becomes apparent around X=3.6α. As a result, practical upper limit is X=3.6α.

The relationship between α and X(α) is as follows.

Suppose that the horizontal axis denotes the real size of α in mm units, and the vertical axis is exppresed as upper or lower limit of a singular region in unit α. Around α=1.2–3.5 mm, the upper limit of X is almost constant (X=3.6α). Around α=1.2–3.5 mm, the lower limit of X is 0.1α.

If α becomes larger, lower limit of X becomes less than 0.1α. If α becomes more large, lower limit of X tends to close to zero. If α becomes smaller, lower limit of X becomes more than 0.23α.

The above explanation was provided under the assumption that "disturbance current" caused by line current is present. The same shielding effect can be obtained for magnetic field disturbance caused by disturbance current conductor (not line current), external magnetic field and an external magnetic material and so on.

As in the case of the embodiments 1 and 2 mentioned so far, the two Hall elements 30A and 30B are placed below the two flux concentrators 28A and 28B in the embodiment 3 described above. As shown in FIG. 7, a single Hall element 70 may be placed instead of the two Hall elements 30A and 30B. In this case, as shown in FIG. 7, the single Hall element 70 is placed over the two flux concentrators 28A and 28B and a gap between the concentrators.

The single Hall element 70 of FIG. 7 has been disclosed in US Patent Publication (U.S. Pat. No. 5,942,895: "MAGNETIC FIELD SENSOR AND CURRENT AND/OR ENERGY SENSOR", Popovic et al.) by the inventor of the present application.

The sensor chip is not restricted to employ the Hall element as long as preferable sensitivity is obtained for a horizontal flux to a chip surface. A magnetoresistive element is also applicable as magnetic detection element.

Hence, according to embodiment 3, it is possible, at the same time, to obtain a shielding effect caused by the second magnetic material 51 and to obtain sufficient sensitivity by forming magnetic path loop between the flux concentrators and the first magnetic material 50. Namely, when a magnetic shielding is done, it is possible to realize a magnetic shield configuration where a measuring flux does not enter mostly to the second magnetic material 51 and it does go through mostly to the magnetic detection element.

Example

Next, an example for "embodiment 3" mentioned above will be discussed.

Figure 14:
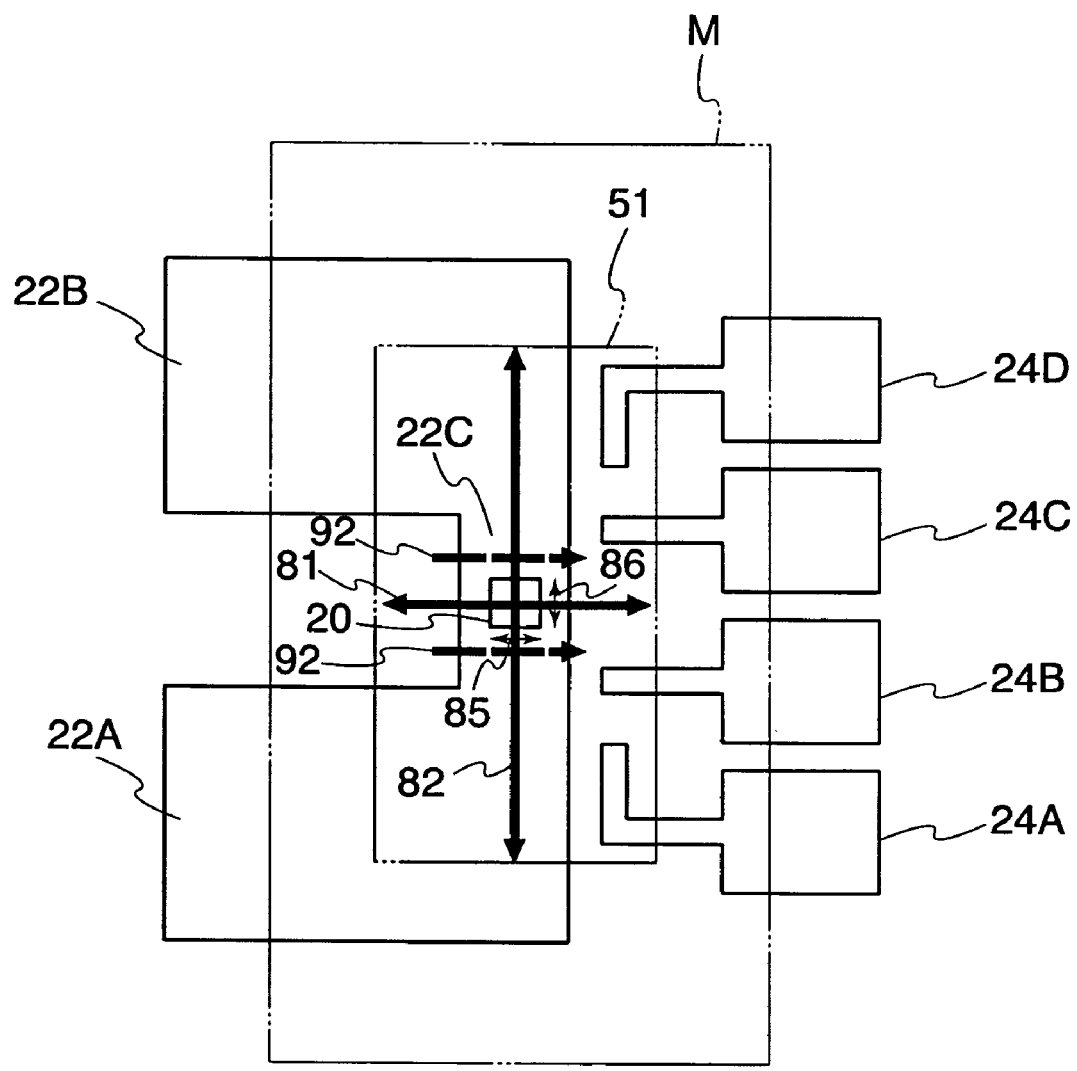
FIG. 14 is an explanatory drawing showing a manufacturing method of embodiment 3.

FIG. 14 shows an example of the top view of a current sensor. FIG. 14 shows that the magnetic detection part containing the magnetic flux concentrators 28A and 28B and a gap is indicated by reference numeral 20, and that a width E of a second magnetic material 51 is indicated by reference numeral 81, a length G of it is indicated by reference numeral 82, and that a whole length α of the magnetic detecting part 20 containing the magnetic flux concentrators 28A and 28B and a gap is depicted in reference numeral 85, and a length of numeral reference 20 toward current flow is depicted in numeral number 86. In FIG. 14, the dimensions of the first magnetic material 50 are omitted.

In the present example of FIG. 14, reference numeral 85 indicating a width α of the magnetic detection part containing the flux concentrators 28A and 28B and a gap was ranged from 1.74 to 3.04 mm.

If the width 81, the length 82, and the thickness 83 of the second magnetic material 51 are large in some extent, a sufficient magnetic shielding effect can be achieved, so selection variety of sizes of the second magnetic material 51 is not so narrow. For an example, it is sufficient to achieve magnetic shielding by configuring width 81 as 7 mm, lenth 82 as 10 mm, thickness 83 as 0.35 mm. This holds true also for the first magnetic material 50. To let the first magnetic material 50 to function as magnetic shield plate and magnetic path (yoke), there is a variety of sizes A, C, B to choose to achieve the same level of effects. For an example, it is enough to choose a width A=7 mm, a length C=10 mm, a thickness B=0.35 mm.

The two magnetic materials 50 and 51 placed above and below the magnetic field sensor chip 20 are not restricted each other to the same shape and size mentioned so far. Further, each of a shape of the magnetic materials 50 and 51 is not restricted to a single thin plate-like shape (rectangular and parallelepiped).

The essence of the present invention is a configuration for sandwiching a current conductor 22C and the magnetic field sensor chip 20 with, at least, the two magnetic materials 50 and 51 in proper positions. Thus, the present embodiment makes it possible to achieve a reasonable measuring sensitivity and an enough magnetic shielding effect while taking a balance of them. As described above, a distance X between the second magnetic material 51 and a magnetic detection surface of the magnetic field detection element such as a Hall element, etc is significant.

From the top view, the center of the current conductor and the magnetic field sensor chip is aligned with the center of the first magnetic material 50 and that of the second magnetic material 51. Actually, even in the event of some displacement of them, a sufficient magnetic shielding effect can be realized, while keeping some extent of sensitivity (while not degrading sensitivity so much).

When the second magnetic material 51 is somewhat large relative to the length 86 and the width 85 of the magnetic field sensor chip including the flux concentrators, a large change does not appear in the measuring sensitivity and the magnetic shielding effect even in the event of a somewhat large displacement perpendicular to a measuring magnetic field (toward direction of current flow). As for a displacement in parallel with a measuring magnetic field 92, accuracy of 0.1 mm is much sufficient.

Therefore, viewing from the top of the molded package, when the second magnetic material 51 somewhat largely covers the magnetic field detecting part including the flux concentrators, it is possible to obtain predetermined measuring sensitivity and magnetic shielding effect without a necessity in accuracy in handling displacement of the center position (in top view) of the magnetic material.

The magnetic shielding effect can be exerted on disturbance of a magnetic field that is caused by a parallel magnetic field from the outside, an external magnetic material and so on, as well as a current line which is placed on the top, the bottom, and the sides of the package, and which is in parallel with or perpendicular to the magnetic detection surface.

For example, in the case that only the first magnetic material 50 (length 10 mm×width 7 mm×thickness 0.35 mm) is provided, when an another same shape of the first magnetic material 50 is placed above the current sensor, if a distance is less than about 10 mm, the output deviation of the sensor is more than 1%.

In such a situation, even in the case of disturbance caused by magnetic materials placed closely, a remarkable magnetic shielding effect can be achieved by the second magnetic material 51.

The first magnetic material 50 and the second magnetic material 51 are placed in parallel with the current conductor and the magnetic field sensor chip. For example, even when the first magnetic material 50 and the second magnetic material 51 are placed in a truncated chevron shape and the current conductor and the magnetic field sensor chip are interposed between the magnetic materials, it is also possible to obtain the magnetic shielding effect.

The magnetic shielding effect can be obtained even when the first magnetic material 50 and the second magnetic material 51 are placed in parallel with each other and the current conductor and the magnetic field sensor chip are not in parallel to the magnetic materials but are somewhat tilted.

The magnetic material sandwiching a magnetic sensor chip 20 and a current conductor 22C are not restricted to use one for upside and one for downside.

Even when the magnetic shielding effect degrades due to an extremely small thickness of the second magnetic material 51, the magnetic shielding effect can be improved by vertically stacking a plurality of magnetic materials.

When the sizes E and G (FIG. 10) of the second magnetic material 51 are small, a sufficient magnetic shielding effect can be achieved by horizontally arranging a plurality of magnetic materials.

In this embodiment, with the two-layer structure of the magnetic materials, in addition to the magnetic shielding effect against an external flux, a flux is less prone to leak from the inside of the current sensor to a surrounding external part.

Figure 15A:
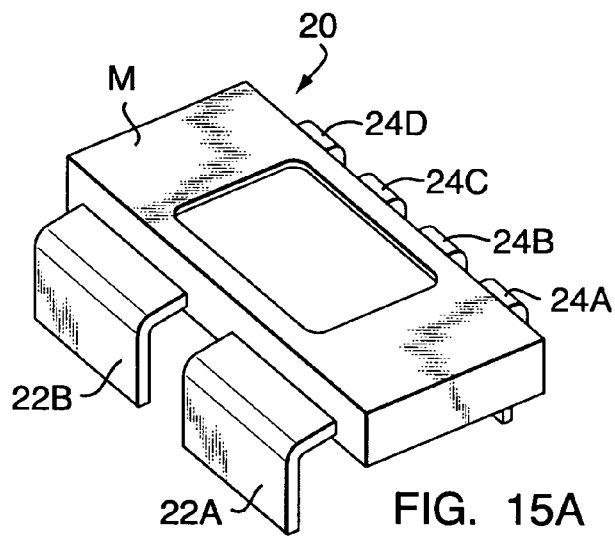
FIG. 15A is an explanatory drawing showing a manufacturing method of embodiment 3.
Figure 15B:
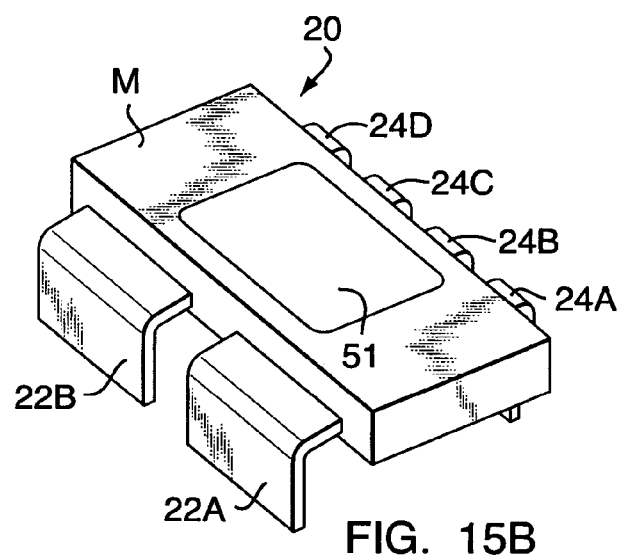
FIG. 15B is an explanatory drawing showing the manufacturing method of embodiment 3.
Figure 15C:
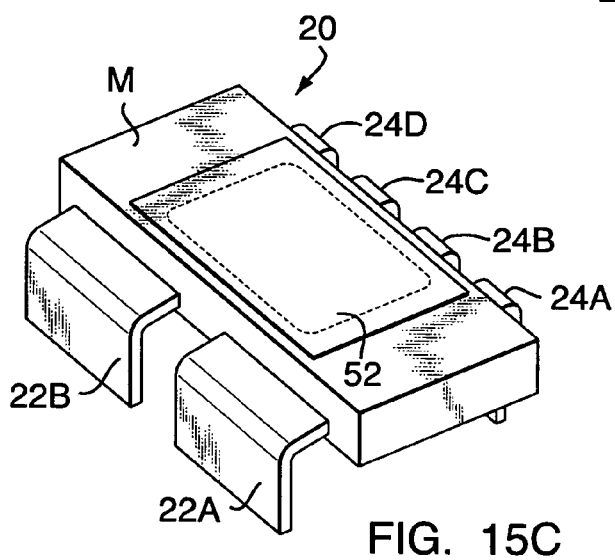
FIG. 15C is an explanatory drawing showing the manufacturing method of embodiment 3.

Referring to FIGS. 15A to 15C, a manufacturing method of embodiment 3 will be explained in the following.

In the Figs. the package type is expressed in DIP (Dual Inline Package). But it is not restricted to DIP. For an example, package surface mount type like SOP is also applicable in this invention. In addition, a configuration of a terminal for measuring (shape, bending) is not restricted to those shown in the Figs.

The first magnetic material is usually mounted inside a package molded in plastics while being brought most close to the current conductor 22C in the present example. The following will explain a manufacturing method in case that the second magnetic material 51 is not mounted inside the molded package from the beginning stage.

When the second magnetic material (shield plate) 51 is placed on the upper surface of the molded package, it is fixed by an adhesive, resin, fiber or a cover, and so on.

When the second magnetic material (shield plate) 51 is mounted while being lifted up from the upper surface of the molded package, a spacer made of a non-magnetic material is inserted with an accurately controlled thickness, and fixed by an adhesive, resin, fiber, a cover, and so on or by a non-magnetic spacer itself.

When the second magnetic material (shield plate) 51 is mounted below the upper surface of the molded package, a bored surface is made substantially in parallel with the current conductor 22C, the magnetic field sensor chip 20 including the flux concentrators, and the first magnetic material 50. For an example, this is done by an industrial instrument. FIG. 15A shows an example of boring the upper surface of the molded package.

FIG. 15B is a view showing that the second magnetic material 51 is inserted into the bored hole.

FIG. 15C shows an example in which a lid 52 is put after the second magnetic material 51 is inserted. A plate-like lid is not the only covering that can be used. Instead of using the lid 52, a light coating of resin, fiber and so on may be applied.

Or when the package is molded, a concave surface is formed in a die mold from the beginning in such a way that a soft magnetic material is placed over the upper surface of an island of the current conductor 22C later.

When plate-like magnetic materials are used as the first magnetic material 50 and the second magnetic material 51, the sensor can be assembled with ease. Namely, since a bending process is not necessary, it is more preferable to insert a plate in view of workability.

Figure 16:
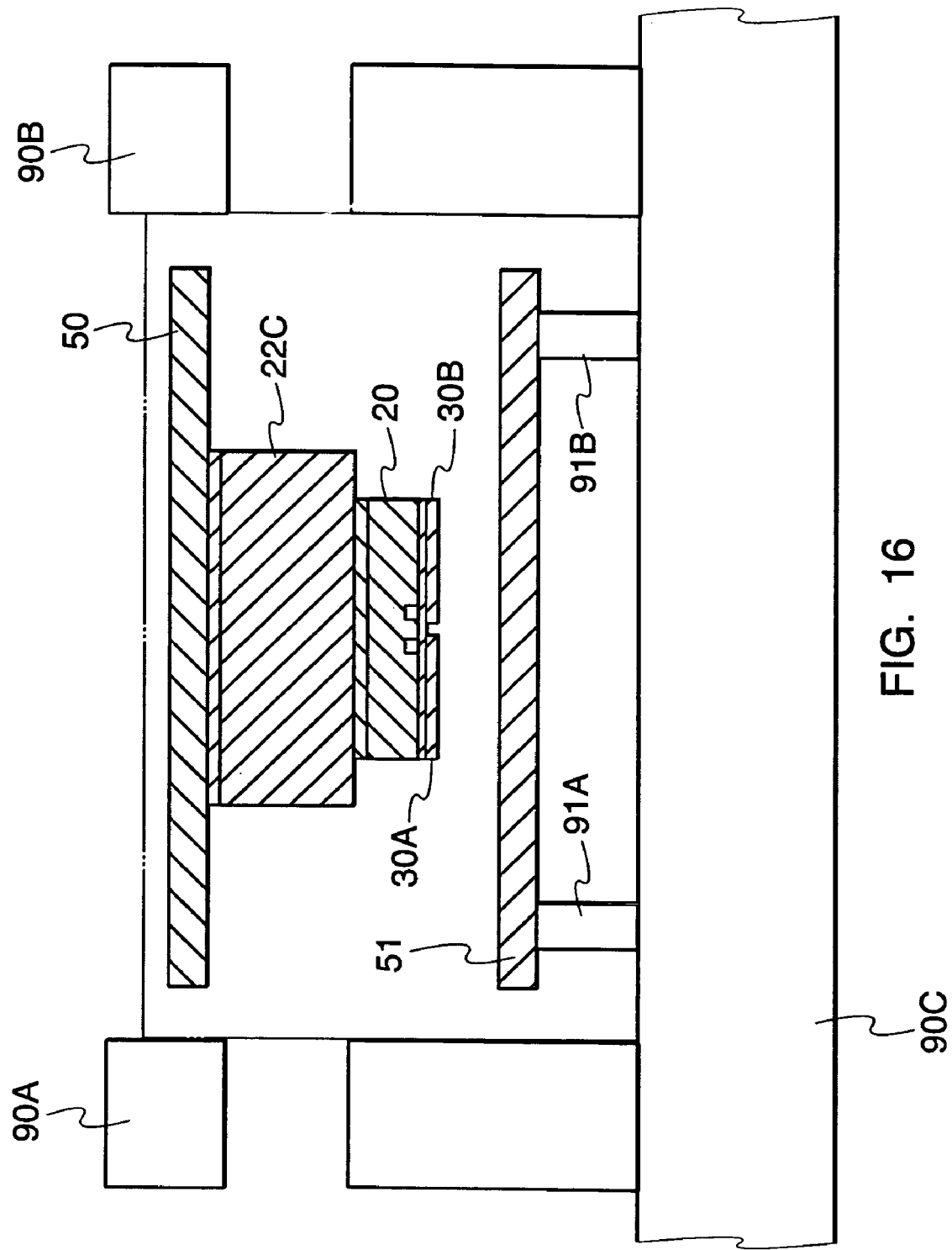
FIG. 16 is an explanatory drawing showing the manufacturing method of embodiment 3.

FIG. 16 shows a method of manufacturing a current sensor which originally includes the second magnetic material 51. FIG. 16 shows a sectional view of a die mold of the current sensor. The bottom of the mold has, for example, protruding parts 91A and 91B shown in FIG. 16, the second magnetic material 51 is placed on the bottom of the mold, and the second magnetic material 51 is lifted from the bottom of the mold by the protruding parts 91A and 91B.

Besides, the protruding parts 91A and 91B are not always restricted to the shapes in FIG. 16. For example, sticks extending laterally may be used instead of the protruding parts 91A and 91B.

The magnetic field sensor chip containing the flux concentrators 28A and 28B is die-bonded on the current conductor 22C. Further, the first magnetic material 50 is also closely fixed on the current conductor 22C. Since lead frame terminals 24A to 24D and the current conductor 22A to 22C are formed as one (Ref. FIG. 4A), the lead frame terminals 24A to 24D and the current conductor 22A, 22B, 22C are turned upside down together and are placed in the mold. The magnetic sensor chip and terminals for measuring are wire-bonded. In FIG. 16, a slot for placing a tie bar is illustrated but an expression of a tie bar of the lead frame positioned to the slot is omitted.

In the state of FIG. 16, mold resin is put in the mold. After curing, on the upper surface (or the side) of a molded package taken out from the mold, a hole or a ditch is formed, because of support for the second magnetic material 51 in the mold. Thus, as necessary, the hole or the ditch is filled with a coating, a resin, fiber, an adhesive, a cover, and so on.

Therefore, it is possible to mass-produce a current sensor having the two magnetic materials 50 and 51, which are placed so as to sandwich the current conductors and the magnetic field sensor chip including the flux concentrator, in the molded package.

As described above, the present invention makes it possible to realize a low-cost current sensor suitable for mass production and a manufacturing method thereof. The current sensor has a small size with high sensitivity and can be packaged in a standard assembly line which is typically used for manufacturing of an integrated circuit.

Further, by adding first magnetic material on the backside of an island, the present invention makes it possible to efficiently reduce the influence of an external flux and improve the sensitivity without sacrificing mass productivity.

Furthermore, by adding a second magnetic material the present invention makes it possible to obtain sufficient shielding effect against a disturbance flux without degrading the detecting sensitivity of the flux.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

The invention claimed is:

1. A current sensor comprising:
   a housing of molded plastics;
   a metallic current conductor through which a current to be measured flows;
   a magnetic field sensor chip containing at least one magnetic field detection element, the magnetic field sensor chip being placed on a side of the current conductor;
   a flux concentrator placed on the magnetic field sensor chip for urging a flux generated by the current flowing through the current conductor to pass through the at least one magnetic field detection element;
   a plurality of input and output terminals, each of the input and output terminals having an end that is electrically connected to a corresponding terminal of the magnetic field sensor chip, wherein a portion of the current conductor carrying the magnetic field sensor chip lies in a first plane and said ends of the input and output terminals lie in a second plane oriented substantially parallel to the first plane, and wherein a distance between the first and second plane substantially disappears or is substantially the same as a thickness of the magnetic field sensor chip;
   a first magnetic material located on a backside of the current conductor, said backside located opposite to the side that the magnetic field sensor chip is placed on; and
   a second magnetic material located above the magnetic field sensor chip.

2. The current sensor as claimed in claim 1, wherein a position of the second magnetic material is set so as to satisfy $0.1\alpha \leq X \leq 3.6\alpha$ where $\alpha$ represents a whole length of the flux concentrator along a direction of the flux generated by the current flowing through the current conductor and X represents a distance between a magnetic detecting surface of the at least one magnetic field detection element and the second magnetic material.

3. The current sensor as claimed in claim 1, wherein the flux concentrator is composed of a pair of members having a gap of a predetermined width.

4. The current sensor as claimed in claim 2, wherein the flux concentrator is composed of a pair of members having a gap of a predetermined width.

5. A method of manufacturing a current sensor, comprising the steps of:
   forming a thin plate-like metal into a leadframe containing a current conductor and input and output terminals;
   placing a magnetic field sensor chip containing at least one magnetic field detection element on a side of the current conductor;
   connecting electrical terminals of the magnetic field sensor chip to the input and output terminals;
   forming a plastic housing by molding the current conductor, the magnetic field sensor chip and the input and output terminals;

separating the current conductor and the input and output terminals from each other;

providing a first magnetic material on a backside of the current conductor, said backside being located opposite to the side that the magnetic field sensor chip is placed on; and providing a second magnetic material located above the magnetic field sensor chip.

6. The method according to claim 5, wherein a position of the second magnetic material is set so as to satisfy $0.1\alpha \leqq X \leqq 3.6\alpha$ where $\alpha$ represents a whole length of the flux concentrator along a direction of the flux generated by the current flowing through the current conductor and X represents a distance between a magnetic detecting surface of the magnetic field detection element and the second magnetic material.

7. The method according to claim 5, wherein the first and second magnetic material is provided before the plastic housing is formed.

8. The method according to claim 5, wherein the second magnetic material is provided after the plastic housing has been formed.

* * * * *